(12) United States Patent
Date et al.

(10) Patent No.: US 12,014,773 B2
(45) Date of Patent: *Jun. 18, 2024

(54) SEMICONDUCTOR STORAGE DEVICE

(71) Applicant: Kioxia Corporation, Tokyo (JP)

(72) Inventors: Hiroki Date, Chigasaki Kanagawa (JP); Takeshi Nakano, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 140 days.

This patent is subject to a terminal disclaimer.

(21) Appl. No.: 17/882,128

(22) Filed: Aug. 5, 2022

(65) Prior Publication Data

US 2022/0375517 A1 Nov. 24, 2022

Related U.S. Application Data

(63) Continuation of application No. 17/183,933, filed on Feb. 24, 2021, now Pat. No. 11,450,383.

(30) Foreign Application Priority Data

Jul. 15, 2020 (JP) ................................. 2020-121488

(51) Int. Cl.
*G11C 16/26* (2006.01)
*G11C 11/56* (2006.01)
*G11C 16/04* (2006.01)
*H10B 41/27* (2023.01)
*H10B 43/27* (2023.01)

(52) U.S. Cl.
CPC ...... *G11C 11/5642* (2013.01); *G11C 11/5671* (2013.01); *G11C 16/0483* (2013.01); *G11C 16/26* (2013.01); *H10B 41/27* (2023.02); *H10B 43/27* (2023.02)

(58) Field of Classification Search
CPC ....................... G11C 11/5642; G11C 11/5671
See application file for complete search history.

(56) References Cited

U.S. PATENT DOCUMENTS

| 7,813,181 | B2 | 10/2010 | Cernea |
| 9,899,098 | B1 | 2/2018 | Kaneko et al. |
| 10,978,153 | B1 | 4/2021 | Liu et al. |
| 11,450,383 | B2* | 9/2022 | Date ..................... G11C 16/26 |
| 2016/0019971 | A1 | 1/2016 | Horii |
| 2017/0140814 | A1 | 5/2017 | Puthenthermadam et al. |
| 2021/0082499 | A1 | 3/2021 | Date |
| 2021/0166769 | A1* | 6/2021 | Liang .................... G11C 16/08 |

* cited by examiner

*Primary Examiner* — Min Huang
(74) *Attorney, Agent, or Firm* — Foley & Lardner LLP

(57) ABSTRACT

A semiconductor storage device includes: a first memory cell and a second memory cell that are adjacent to each other and connected to each other in series; a first word line connected to the first memory cell; a second word line connected to the second memory cell; and a control circuit. The control circuit is configured to, in a first read operation to read a first bit stored in the first memory cell, apply a first voltage to the first word line, and then, apply a first read voltage lower than the first voltage, to the first word line, and apply a second voltage to the second word line, and then, apply a third voltage lower than the second voltage and higher than the first voltage, to the second word line. The third voltage is applied to the second word line after the first read voltage is applied to the first word line.

20 Claims, 12 Drawing Sheets

SEMICONDUCTOR STORAGE DEVICE

CROSS-REFERENCE TO RELATED APPLICATION(S)

This application is a continuation of U.S. patent application Ser. No. 17/183,933, filed Feb. 24, 2021, which is based upon and claims the benefit of priority from Japanese Patent Application No. 2020-121488, filed Jul. 15, 2020, the entire contents of which are incorporated herein by reference.

FIELD

Embodiments described herein relate generally to a semiconductor storage device.

BACKGROUND

A NAND type flash memory is a semiconductor storage device capable of storing data in a non-volatile manner.

DETAILED DESCRIPTION

Figure 1:
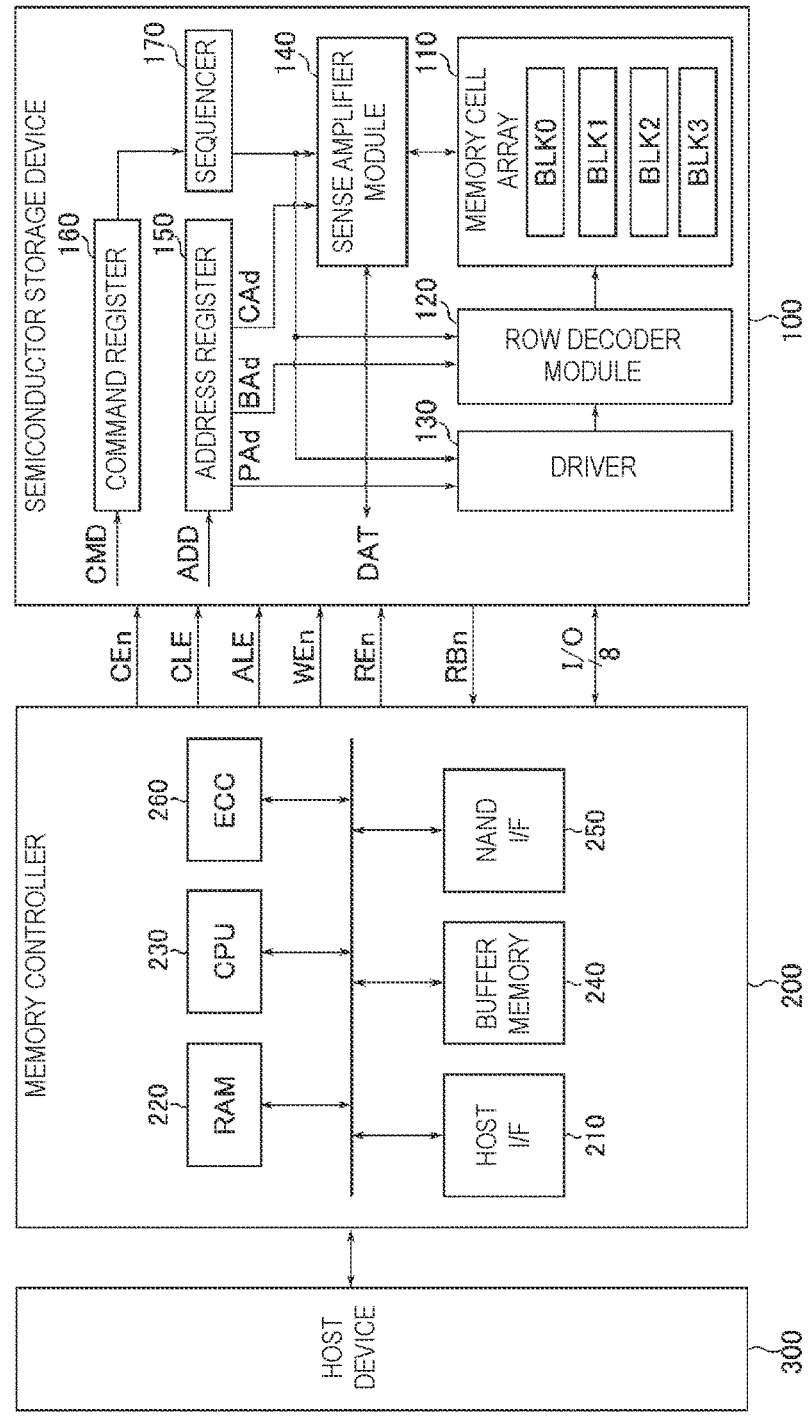
FIG. 1 is a block diagram illustrating an entire configuration of a memory system that includes a semiconductor storage device according to a first embodiment.

At least one embodiment provides a semiconductor storage device capable of reducing a time required for a read operation.

In general, according to at least one embodiment, a semiconductor storage device includes: a first memory cell and a second memory cell that are adjacent to each other and connected to each other in series; a first word line connected to the first memory cell; a second word line connected to the second memory cell; and a control circuit. The control circuit is configured to, in a first read operation to read a first bit stored in the first memory cell, apply a first voltage to the first word line, and then, apply a first read voltage lower than the first voltage, to the first word line, and apply a second voltage to the second word line, and then, apply a third voltage lower than the second voltage and higher than the first voltage, to the second word line. The third voltage is applied to the second word line after the first read voltage is applied to the first word line.

Hereinafter, at least one embodiment of the present disclosure will be described with reference to the accompanying drawings. In the descriptions herein below, components that have a similar function and configuration will be denoted by the same reference numerals. Further, when multiple components having the same reference numeral need to be discriminated from each other, the components will be discriminated by adding suffixes to the reference numeral. When the multiple components do not need to be discriminated from each other, the components will be only denoted by the common reference numeral without adding suffixes.

1. First Embodiment

A first embodiment will be described. Hereinafter, a NAND flash memory which is a nonvolatile memory and a memory system provided with the NAND flash memory will be described as an example.

1.1 Configuration

A configuration of a memory system according to the first embodiment will be described.

1.1.1 Memory System

First, an outline of the configuration including the memory system according to the first embodiment will be described using FIG. 1.

As illustrated in FIG. 1, a memory system 1 includes a semiconductor storage device (a NAND flash memory) 100 and a memory controller 200. For example, the combination of the semiconductor storage device 100 and the memory controller 200 may make up a single semiconductor device which is, for example, a memory card such as an SD™ card, an SSD (solid state drive) or the like.

The semiconductor storage device 100 may include a plurality of memory cells, and stores data in a nonvolatile manner. The memory controller 200 is connected to the semiconductor storage device 100 by a NAND bus, and connected to a host device 300 by a host bus. The memory controller 200 controls the semiconductor storage device 100, and accesses the semiconductor storage device 100 in response to a command received from the host device 300. The host device 300 is, for example, a digital camera, a personal computer or the like, and the host bus is, for example, a bus such as an SD™ interface, SAS (serial attached SCSI (small computer system interface)), SATA (serial ATA (advanced technology attachment)) or PCIe (peripheral component interconnect express). The NAND bus performs transmission/reception of signals according to a NAND interface.

Specific examples of the signals of the NAND interface are a chip enable signal CEn, a command latch enable signal CLE, an address latch enable signal ALE, a write enable signal WEn, a read enable signal REn, a ready/busy signal RBn, and an input/output signal I/O.

The signal CEn is a signal for enabling the semiconductor storage device 100, and is asserted at an "L (Low)" level. The signals CLE and ALE are signals for notifying the semiconductor storage device 100 that input signals I/O to the semiconductor storage device 100 are a command and an address, respectively. The signal REn is asserted at the "L" level, and is a signal for reading an output signal I/O from the semiconductor storage device 100. The signal WEn is also asserted at the "L" level, and is a signal for introducing an input signal I/O into the semiconductor storage device 100. The ready/busy signal RBn indicates whether the semiconductor storage device 100 is in a ready state (a state where the semiconductor storage device 100 is able to receive a command from the memory controller 200) or in a busy state (a state where the semiconductor storage device 100 is unable to receive a command from the memory controller 200), and the "L" level indicates the busy state. The input/output signal I/O may be, for example, an 8-bit signal. The input/output signal I/O is data transmitted/received between the semiconductor storage device 100 and the memory controller 200, and is data DAT such as a command CMD, an address ADD, write data or read data.

1.1.2 Memory Controller

Subsequently, the configuration of the memory controller 200 will be described in detail using FIG. 1.

The memory controller 200 is, for example, a SoC (system on a chip), and includes a host interface circuit 210, a RAM (random access memory) 220, a CPU (central processing unit) 230, a buffer memory 240, a NAND interface circuit 250, and an ECC circuit 260. In addition, the functions of the respective units 210 to 260 of the memory controller 200 to be described hereinafter may be implemented by either a hardware configuration or a combined configuration of hardware resources and firmware, for example.

The host interface circuit 210 is connected to the host device 300 via the host bus, and transfers commands and data received from the host device 300 to each of the CPU 230 and the buffer memory 240. Further, the host interface circuit 210 transfers data in the buffer memory 240 to the host device 300 in response to a command of the CPU 230.

The RAM 220 is, for example, a semiconductor memory such as a DRAM, and may be used as a work area of the CPU 230. Further, the RAM 220 stores firmware for managing the semiconductor storage device 100, various management tables or the like.

The CPU 230 controls the entire operation of the memory controller 200. For example, when the CPU 230 receives a write command from the host device 300, the CPU 230 issues a write command to the NAND interface circuit 250 in response. The same applies to a read operation and an erase operation. Further, the CPU 230 executes various processes for managing the semiconductor storage device 100.

The buffer memory 240 temporarily stores write data or read data.

The NAND interface circuit 250 is connected to the semiconductor storage device 100 via the NAND bus, and performs a communication with the semiconductor storage device 100. The NAND interface circuit 250 outputs the signals CEn, ALE, CLE, WEn, and REn to the semiconductor storage device 100 based on a command received from the CPU 230. During the write operation, the NAND interface circuit 250 transfers a write command issued by the CPU 230 and write data in the buffer memory 240 as input/output signals I/O to the semiconductor storage device 100. During the read operation, the NAND interface circuit 250 transfers a read command issued by the CPU 230 as an input/output signal I/O to the semiconductor storage device 100. Further, the NAND interface circuit 250 receives data read from the semiconductor storage device 100 as an input/output signal I/O, and transfers the received data to the buffer memory 240.

The ECC circuit 260 performs an error detecting process and an error correcting process on data to be stored in the semiconductor storage device 100. That is, when data is written, the ECC circuit 260 generates an error correction code, and attaches the error correction code to the write data. When data is read, the ECC circuit 260 decodes the error correction code, and detects the presence/absence of an error bit. When an error bit is detected, the ECC circuit 260 specifies the position of the error bit, and corrects the error. The method of correcting the error includes, for example, a hard bit decoding process and a soft bit decoding process. As a hard bit decoding code used for the hard bit decoding process, for example, a BCH (Bose-Chaudhuri-Hocquenghem) code, an RS (Reed-Solomon) code or the like may be used, and as a soft bit decoding code used for the soft bit decoding process, for example, an LDPC (low density parity check) code or the like may be used.

1.1.3 NAND Flash Memory

Next, the configuration of the semiconductor storage device 100 will be described. As illustrated in FIG. 1, the semiconductor storage device 100 includes a memory cell array 110, a row decoder module 120, a driver 130, a sense amplifier module 140, an address register 150, a command register 160, and a sequencer 170.

The memory cell array 110 includes a plurality of blocks BLK that each include a plurality of nonvolatile memory cells associated with rows and columns. FIG. 1 illustrates, for example, four blocks BLK0 to BLK3. Further, the memory cell array 110 stores data given by the memory controller 200.

The row decoder module 120 selects one of the blocks BLK0 to BLK3 based on a block address BAd in the address register 150, and further, selects a word line in the selected block BLK.

The driver 130 supplies a voltage to the selected block BLK via the row decoder module 120 based on a page address PAd in the address register 150.

During the read operation of data, the sense amplifier module 140 senses a threshold voltage of a memory cell transistor in the memory cell array 110 based on a column address CAd in the address register 150, so as to read data. Then, the sense amplifier module 140 outputs the data DAT to the memory controller 200. During the write operation of data, the sense amplifier module 140 transfers the write data DAT received from the memory controller 200 to the memory cell array 110 based on the column address CAd in the address register 150.

The address register 150 stores an address ADD received from the memory controller 200. The address ADD includes the above-described block address BAd, page address PAd, and column address CAd. The command register 160 stores a command CMD received from the memory controller 200.

The sequencer 170 controls the operation of the entire semiconductor storage device 100 based on the command CMD stored in the command register 160.

1.1.4 Memory Cell Array

Next, an example configuration of the memory cell array of the semiconductor storage device according to the first embodiment will be described.

1.1.4.1 Circuit Configuration

Figure 2:
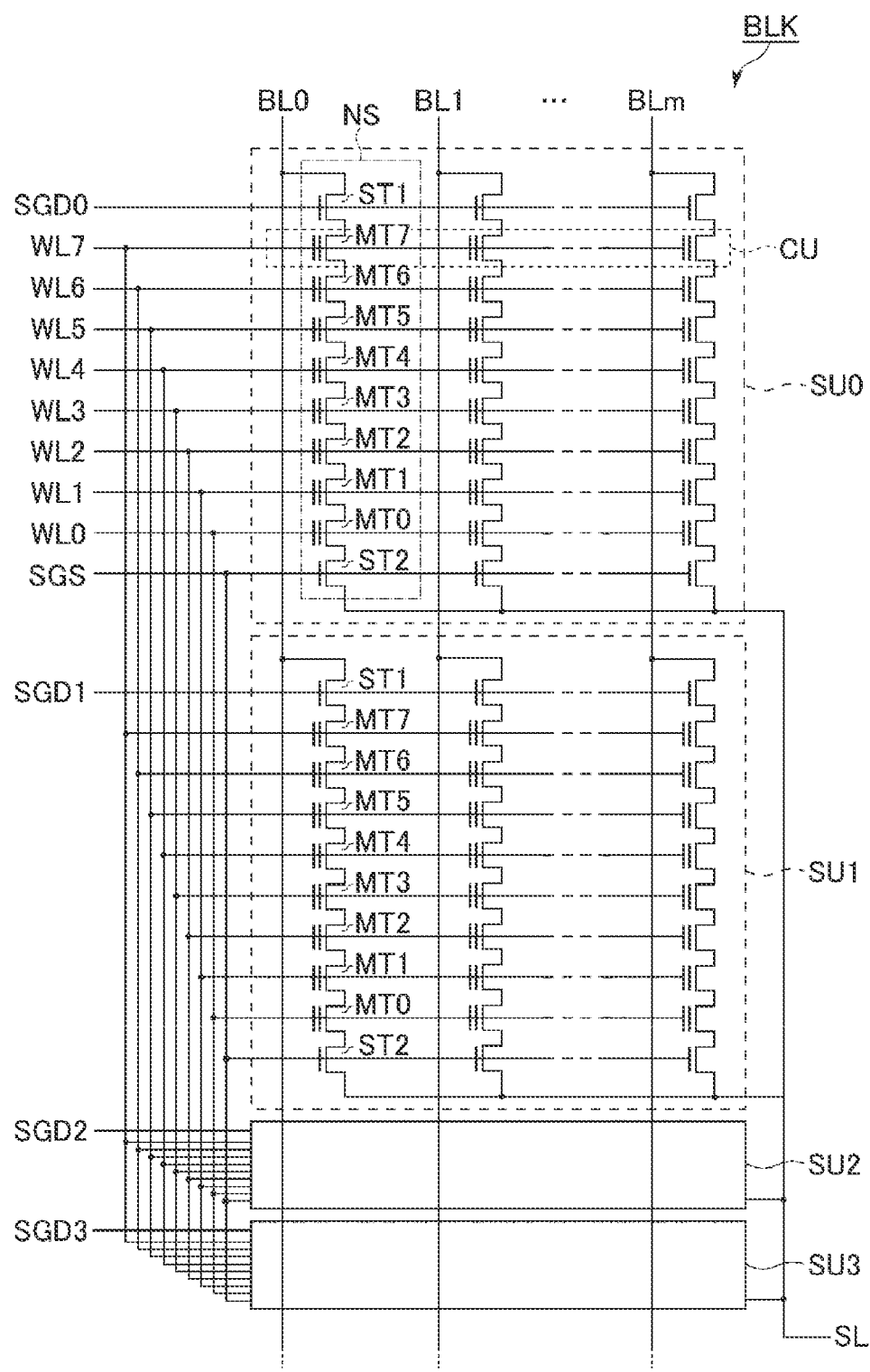
FIG. 2 is a circuit diagram illustrating a configuration of a memory cell array of the semiconductor storage device according to the first embodiment.

FIG. 2 is a circuit diagram illustrating an example configuration of the memory cell array according to the first embodiment. FIG. 2 illustrates one block BLK among the plurality of blocks BLK in the memory cell array 110.

As illustrated in FIG. 2, the block BLK includes, for example, four string units SU (SU0 to SU3). Each string unit SU includes a plurality of NAND strings NS associated with bit lines BL0 to BLm (m is an integer of 1 or more), respectively. Each NAND string NS includes, for example, eight memory cell transistors MT0 to MT7 and select transistors ST1 and ST2. Each memory cell transistor MT includes a control gate and a charge storage layer, and stores charges (electrons) that correspond to data, in a nonvolatile manner. Each of the select transistors ST1 and ST2 is used for selecting a string unit SU during various operations.

In each NAND string NS, the memory cell transistors MT0 to MT7 are connected to each other in series. The drain of the select transistor ST1 is connected to an associated bit line BL, and the source of the select transistor ST1 is connected to one end of the memory cell transistors MT0 to MT7 connected in series. The drain of the select transistor ST2 is connected to the other end of the memory cell transistors MT0 to MT7 connected in series. The source of the select transistor ST2 is connected to a source line SL.

In the same block BLK, the control gates of the memory cell transistors MT0 to MT7 are connected in common to word lines WL0 to WL7, respectively. The gates of the select transistors ST1 within the string units SU0 to SU3 are connected in common to select gate lines SGD0 to SGD3, respectively. The gates of the select transistors ST2 are connected in common to the select gate line SGS.

That is, the block BLK is a group of a plurality of string units SU that share the same word lines WL0 to WL7. The block BLK is, for example, the unit of data erase. That is, data stored in the memory cell transistors MT in the same block BLK are collectively erased.

Each string unit SU is a group of a plurality of NAND strings NS that are connected to different bit lines BL, respectively, and connected to the same select gate line SGD. In the string unit SU, a group of the memory cell transistors MT connected in common to the same word line WL is also referred to as a cell unit CU. For example, a group of equivalent bits stored in the plurality of memory cell transistors MT within the cell unit CU is defined as "one page." The cell unit CU may have a storage capacity for data that correspond to two or more pages, according to the number of bits of data stored in the memory cell transistors MT.

The circuit configuration of the memory cell array 110 described above is not limited to the configuration described above. For example, the number of memory cell transistors MT and the select transistors ST1 and ST2 in each NAND string NS may be freely designed. The number of string units SU in each block BLK may be freely designed.

1.1.4.2 Planar Layout

Next, an example of the structure of the memory cell array according to the first embodiment will be described.

In the drawings referred to herein below, the X axis corresponds to the extending direction of the word lines WL, the Y axis corresponds to the extending direction of the bit lines BL, and the Z axis corresponds to the direction perpendicular to the surface of a semiconductor substrate on which the semiconductor storage device 100 is formed. In the plan view, hatching is appropriately added for easy viewing of the drawing. The hatching added to the plan view is not necessarily related to a material or characteristics of a component to which the hatching is added. In the cross-sectional view, the illustration of components such as insulator layers (interlayer insulating films), wirings, and contacts is appropriately omitted for ease of viewing of the drawing.

Figure 3:
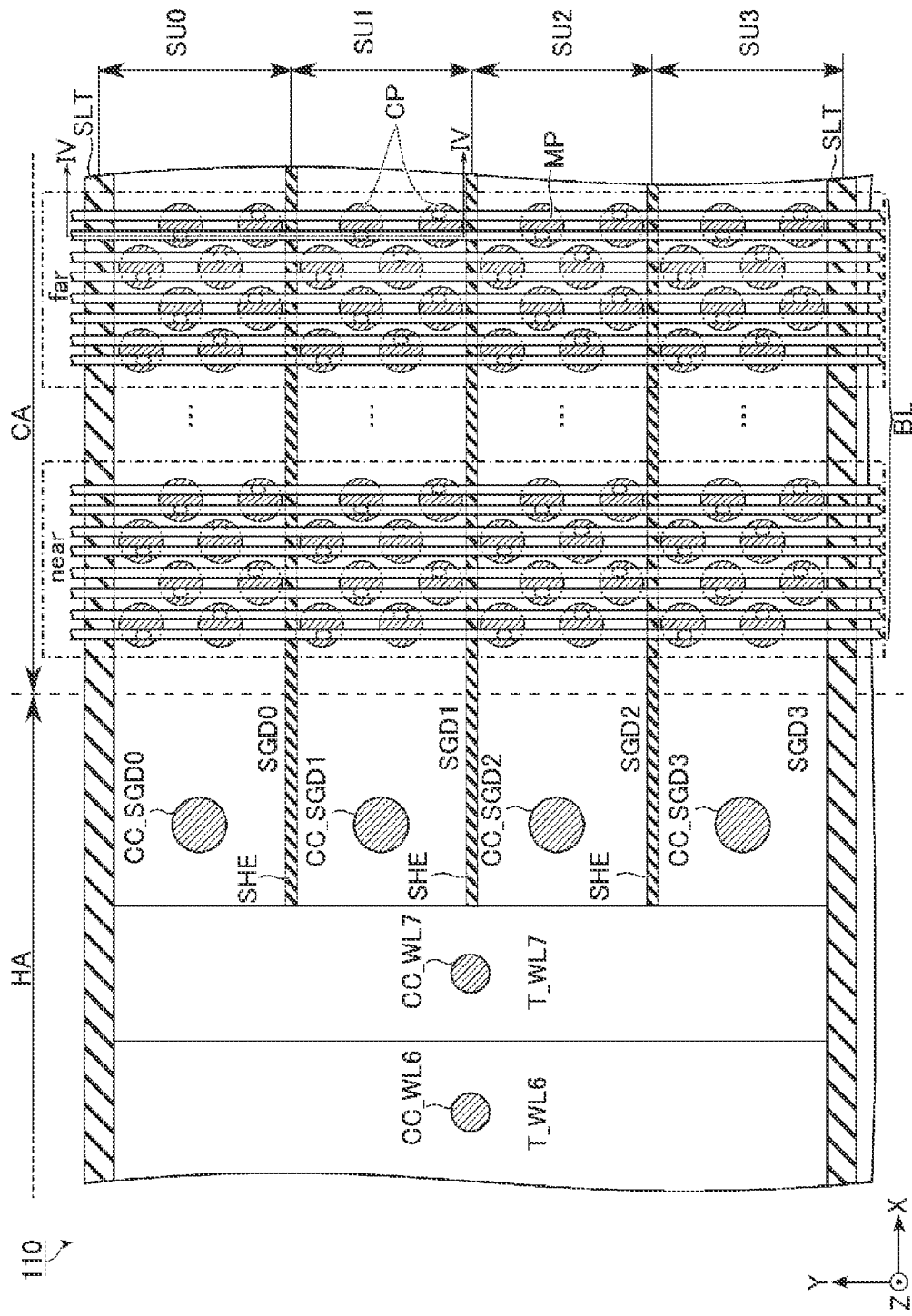
FIG. 3 is a plan view of the memory cell array of the semiconductor memory device according to the first embodiment when viewed from above.

FIG. 3 is a plan view illustrating the planar layout of the memory cell array of the semiconductor storage device according to the first embodiment. FIG. 3 illustrates, for example, a cell area CA that includes structures corresponding to the strings units SU0 to SU3 within a certain block BLK, and a portion of a hookup area HA for drawing a contact CC from a stacked wiring layer of each string unit SU.

As illustrated in FIG. 3, the block BLK of the memory cell array 110 includes, for example, slits SHE and SLT, memory pillars MP, contacts CP and CC, bit lines BL, and stacked wiring layers. The stacked wiring layers include, for example, the select gate lines SGD (SGD0 to SGD3) positioned in the same layer, the seven-layer word lines WL0 to WL7 (partially not illustrated) disposed below the select gate lines SGD, and the select gate line SGS (not illustrated) positioned below the lowermost word line WL0 among the word lines WL0 to WL7. That is, the plurality of stacked wiring layers are stacked from the semiconductor substrate along the Z axis in an order of the select gate line SGS, the word lines WL0 to WL7, and the select gate lines SGD. The plurality of memory pillars MP, the contacts CP, and the bit lines BL are provided in the cell area CA, and the plurality of contacts CC are provided in the hookup area HA.

The plurality of slits SLT each extend along the X axis, and are arranged along the Y axis. The plurality of slits SHE each also extend along the X axis, and are arranged in the Y axis between the adjacent slits SLT. The width of each slit SLT is wider than, for example, the width of each slit SHE. Each of the slits SLT and SHE includes an insulator. The slit SLT divides, for example, the stacked wiring layers that correspond to the word lines WL, the select gate lines SGD, the select gate line SGS and others, which will be described later in FIG. 4. That is, the slit SLT separates the string units SU0 to SU3 and other string units (not illustrated) adjacent to the string units SU0 to SU3 from each other in an insulating manner. Further, the slit SHE divides the stacked wiring layer that corresponds to the select gate lines SGD, into the select gate lines SGD0 to SGD3 that correspond to the string units SU0 to SU3, respectively, and separates the select gate lines from each other in an insulating manner.

In this way, the areas partitioned by the slits SLT and SHE make up the string units SU0 to SU3, respectively. The entire memory cell array 110 is configured in the form that the layout illustrated in FIG. 3 is repeatedly arranged along the Y axis.

In the hookup area HA of FIG. 3, the select gate lines SGD, the word lines WL0 to WL7, and the select gate line SGS form a step shape along the X axis. That is, in the plan view, the word line WL7 has an area T_WL7 that is longer than the select gate lines SGD along the X axis and does not overlap with the select gate lines SGD. The word line WL6 has an area T_WL6 that is longer than the word line WL7 along the X axis and does not overlap with the area T_WL7 of the word line WL7. Hereinafter, although not illustrated in FIG. 3, a word line WLk has an area T_WLk that is longer than a word line WL(k+1) along the X axis and does not overlap with an area T_WL(k+1) of the word line WL(k+1) ($0 \leq k \leq 6$), as described above. The select gate line SGS has an area T_SGS that is longer than the word line WL0 along the X axis and does not overlap with an area T_WL0 of the word line WL0.

Contacts CC_SGD0 to CC_SGD3, CC_WL0 to CC_WL7, and CC_SGS are provided on the select gate lines SGD0 to SGD3, the areas T_WL0 to T_WL7 of the word lines WL0 to WL7, and the area T_SGS of the select gate line SGS, respectively. The contacts CC_SGD0 to CC_SGD3, CC_WL0 to CC_WL7, and CC_SGS function as wirings that electrically connect the select gate lines SGD0 to SGD3, the word lines WL0 to WL7, and the select gate line SGS, respectively, to the row decoder module 120.

In the cell area CA of FIG. 3, the plurality of memory pillars MP are arranged in a staggered pattern of, for example, 16 rows in the area between the adjacent slits SLT. That is, the plurality of memory pillars MP are arranged in a staggered pattern of four rows in each of the string units SU0 to SU3.

The plurality of bit lines BL each extend along the Y axis, and are arranged along the X axis. In the plan view, each bit line BL overlaps with at least one memory pillar MP in each string unit SU, and two bit lines BL overlap with each memory pillar MP. A contact CP is provided between one bit line BL of the plurality of bit lines BL that overlap with the memory pillar MP and the corresponding memory pillar MP. The string unit SU is electrically connected to the corresponding bit line BL via the contact CP formed on the memory pillar MP.

In this way, within the same block BLK (or the same string unit SU), the plurality of memory pillars MP are connected to the same select gate line SGS, word lines WL0 to WL7, and select gate line SGD. Meanwhile, the plurality of memory pillars MP are arranged at positions of different distances from the hookup area HA along the Y axis, within the cell area CA. In the following descriptions, within the cell area CA, the area relatively close to the hookup area HA will be referred to as the area "near," and the area relatively far away from the hookup area HA will be referred to as the area "far," in order to discriminate the areas from each other as necessary.

The portions of the word lines WL in the area "far" are electrically connected to the hookup area HA via the portions of the word lines WL in the area "near." Since a word line WL has a parasitic capacitance between the word line WL and its adjacent word line WL, the word line WL is affected by the relatively large parasitic capacitance at the portion thereof far away from the hookup area HA. That is, the portion of the word line WL in the area "far" is affected by the relatively larger parasitic capacitance than that at the portion of the word line WL in the area "near."

The planar layout of the memory cell array 110 described above is merely an example, and is not limited thereto. For example, the number of slits SHE or the number of string units SU that are arranged between the adjacent slits SLTs may be freely designed. Further, for example, the number and the arrangement of the memory pillars MP, and the bit lines BL connected to the memory pillars MP may also be freely designed. Further, the areas T_SGS and T_WL0 to W_TL7 may be formed along the Y axis, without being limited to the X axis.

1.1.4.3 Cross-Sectional Structure

Figure 4:
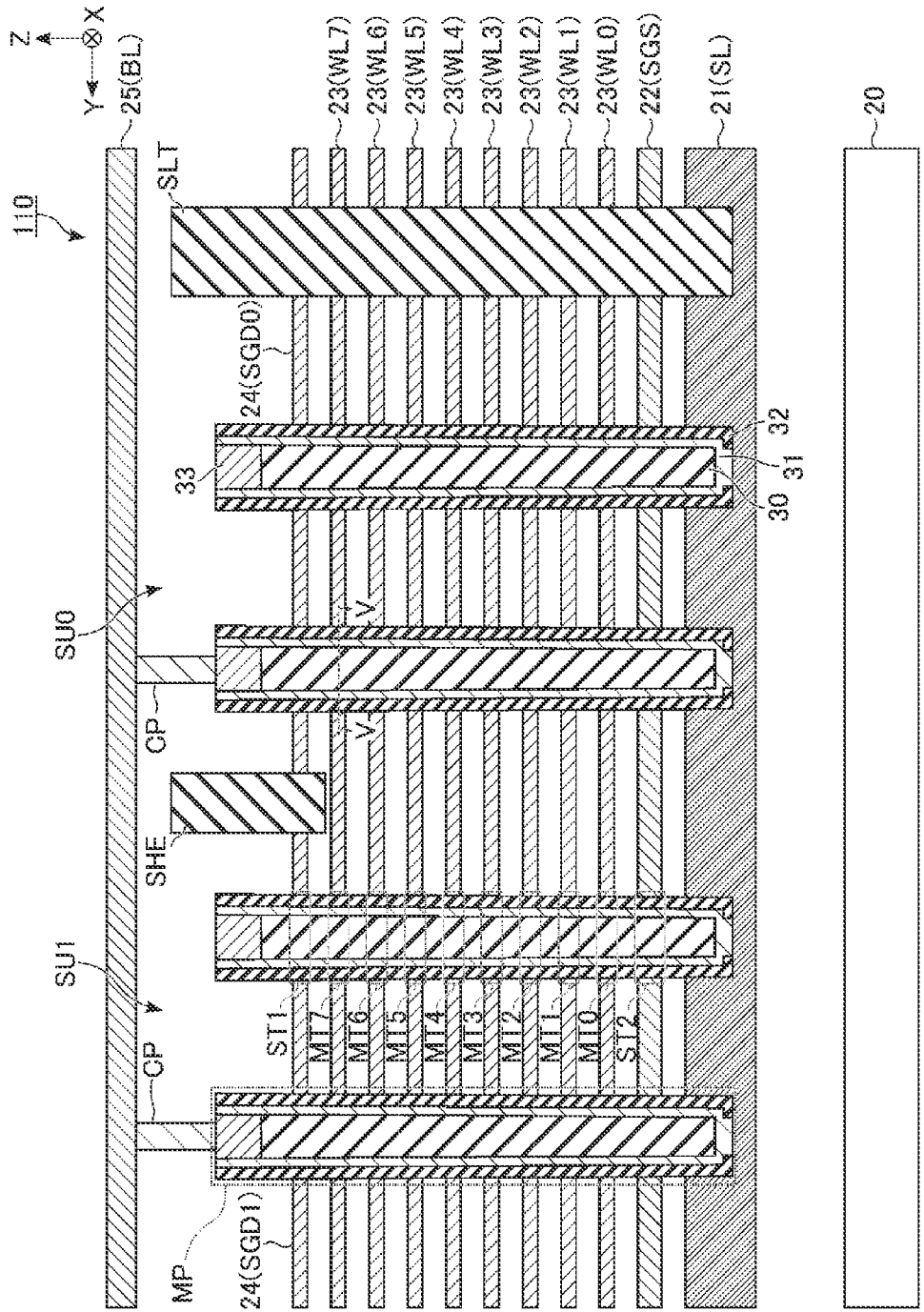
FIG. 4 is a cross-sectional view of cell areas of the memory cell array which is taken along line IV-IV of FIG. 3.

FIG. 4 is a cross-sectional view of the memory cell array 110 illustrated in FIG. 3, which is taken along the line IV-IV in FIG. 3, and illustrates an example of the cross-sectional structure of the string units SU0 and SU1.

As illustrated in FIG. 4, a conductor layer 21 is provided above a semiconductor substrate 20 via an insulator layer (not illustrated). A circuit such as the row decoder module 120 or the sense amplifier module 140 may be provided in the insulator layer. The conductor layer 21 is formed, for example, in a plate shape that extends along the XY plane, and serves as a source line SL. The conductor layer 21 contains, for example, silicon (Si).

A conductor layer 22 is staked above the conductor layer 21 via an insulator layer (not illustrated). The conductor layer 22 is used as the select gate line SGS.

A plurality of insulator layers (not illustrated) and a plurality of conductor layers 23 are alternately stacked above the conductor layer 22. The conductor layers 23 are used as the word lines WL0 to WL7, respectively, in order from the semiconductor substrate 20. Each of the conductor layers 22 and 23 is formed, for example, in a plate shape that extends along the XY plane, and contains, for example, tungsten (W).

A conductor layer 24 is stacked above the uppermost conductor layer 23 via an insulator layer (not illustrated). The conductor layer 24 is used as the select gate lines SGD. The conductor layer 24 is formed, for example, in a plate shape that extends along the XY plane, and contains, for example, tungsten (W).

A conductor layer 25 is provided above the conductor layer 24 via an insulator layer (not illustrated). For example, the conductor layer 25 extends along the Y axis, and is arranged in the form of multiple lines along the X axis which are used as the bit lines BL, respectively. The conductor layer 25 contains, for example, copper (Cu).

Each memory pillar MP extends along the Z axis, and penetrates the conductor layers 22 to 24 to be in contact with the conductor layer 21 at the bottom portion thereof. Further, the memory pillar MP includes, for example, a core film 30, a semiconductor film 31, a stacked film 32, and a semiconductor portion 33.

The core film 30 extends along the Z axis. The upper end of the core film 30 is positioned, for example, above the conductor layers 23, and the lower end of the core film 30 is positioned, for example, inside the conductor layer 21. The core film 30 contains, for example, an insulator such as silicon oxide ($SiO_2$).

The semiconductor film 31 covers the bottom surface and the lateral surface of the core film 30, and includes, for example, a cylindrical portion. The lower end of the semiconductor film 31 is in contact with the conductor layer 21, and the upper end of the semiconductor film 31 is positioned above the conductor layers 23.

The stacked film 32 covers the lateral surface and the bottom surface of the semiconductor film 31, except for the portion where the conductor layer 21 and the semiconductor film 31 are in contact with each other, and includes, for example, a cylindrical portion. The structure of the stacked film 32 will be described in detail later with reference to FIG. 5.

The semiconductor portion 33 may cover the upper surface of the core film 30, and is in contact with the inner wall portion of the semiconductor film 31 above the core film 30. The semiconductor portion 33 is provided, for example, in a columnar shape, and is positioned at the upper end of the memory pillar MP.

The contact CP is provided in a columnar shape on the upper surface of the semiconductor film 31 and the semiconductor portion 33 within the memory pillar MP. The cross-sectional view of FIG. 4 represents the contacts CP that correspond to two memory pillars MP among the four memory pillars MP. For the other two memory pillars MP, the contacts CP are provided close to the depth side or the front side in FIG. 4. The upper surface of each contact CP is in contact with and is electrically connected to one corresponding conductor layer 25 (a bit line BL).

The slit SLT extends, for example, in a plate shape along the XZ plane, and divides the conductor layers 22 to 24 in the Y direction. The upper end of the slit SLT is positioned between the conductor layers 24 and 25. The lower end of the slit SLT is disposed, for example, in the layer where the conductor layer 21 is provided. The slit SLT contains, for example, an insulator such as silicon oxide ($SiO_2$).

The slit SHE extends, for example, in a plate shape along the XZ plane, and divides the conductor layer 24 into two portions that are arranged along the Y direction. In the example of FIG. 4, the two portions obtained by dividing the conductor layer 24 are used as the select gate lines SGD0 and SGD1, respectively. The upper end of the slit SHE is positioned between the conductor layers 24 and 25. The lower end of the slit SHE is positioned, for example, between the layer where the uppermost conductor layer 23 is provided, and the layer where the conductor layer 24 is provided. The slit SHE contains, for example, an insulator such as silicon oxide.

The upper end of the slit SLT, the upper end of the slit SHE, and the upper ends of the memory pillars MP may or may not be aligned, for example.

Figure 5:
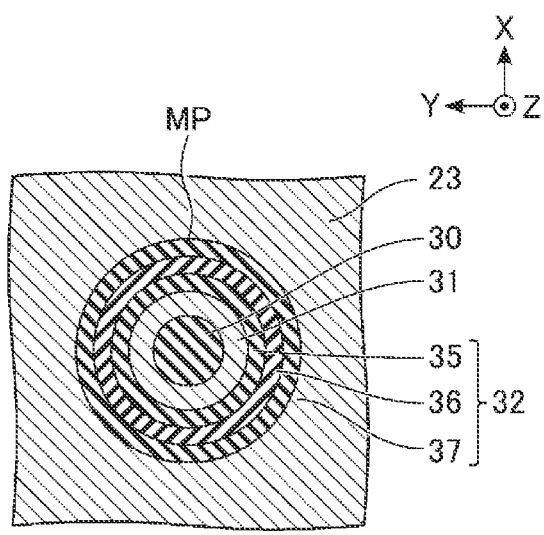
FIG. 5 is a cross-sectional view of a memory pillar which is taken along line V-V of FIG. 4.

FIG. 5 is an XY cross-sectional view of the memory pillar MP of FIG. 4 which is taken along the line V-V in FIG. 4, and illustrates an example of a cross-sectional structure including the memory pillar MP and the conductor layer 23 around the memory pillar MP.

As illustrated in FIG. 5, the core film 30 is provided substantially at the center of the memory pillar MP. The semiconductor film 31 and the stacked film 32 are concentrically provided in this order around the core film 30. That is, the semiconductor film 31 and the stacked film 32 are formed along the Z direction to surround the entire lateral surface of the core film 30.

The stacked film 32 is a film in which a tunnel insulating film 35, an insulating film 36, and a block insulating film 37 are stacked in this order. Each of the tunnel insulating film 35 and the block insulating film 37 contains, for example, silicon oxide, and the insulating film 36 contains, for example, silicon nitride (SiN).

In the structure of the memory pillar MP described above, the portion where the memory pillar MP and the conductor layer 22 cross each other functions as the select transistor ST2. The portions where the memory pillar MP and the conductor layers 23 cross each other function as the memory cell transistors MT. The portion where the memory pillar MP and the conductor layer 24 cross each other functions as the select transistor ST1.

That is, the semiconductor film 31 is used as a channel for each of the memory cell transistors MT and the select transistors ST1 and ST2. The insulating film 36 is used as a charge storage film of each of the memory cell transistors MT and the select transistors ST1 and ST2. Thus, each memory pillar MP functions as, for example, one NAND string NS.

The structure of the memory cell array 110 described above is merely an example, and the memory cell array 110 may have other structures. For example, the number of conductor layers 23 may be designed based on the number of word lines WL. The number of layers in which the select gate line SGS or the select gate lines SGD are provided is not limited to one, and may be freely designed. When the select gate line SGS is provided in a plurality of layers, conductors different from the conductor layer 22 may be used. The memory pillar MP and the conductor layer 25 may be electrically connected to each other via two or more contacts or via other wirings. In the slit SLT, a plurality of types of insulators may be provided, and a contact for electrically connecting the conductor layer 21 to a wiring above the memory cell array 110 may be formed.

1.1.5 Threshold Voltage Distributions of Memory Cell Transistors

Next, threshold voltage distributions of the memory cell transistors MT will be described.

In at least one embodiment, one memory cell transistor MT is capable of storing, for example, 2-bit data. The two bits of the 2-bit data will be referred to as a lower bit and an upper bit. The group of lower bits stored in the memory cells that belong to the same cell unit CU will be referred to as a lower page, and the group of higher bits will be referred to as a higher page. That is, two pages are allocated to one word line WL (one cell unit CU) within one string unit SU, and the string unit SU including the eight word lines WL has the capacity that corresponds to 16 pages. Alternatively, in other words, the "page" may be defined as a portion of a memory space formed in the cell unit CU. While the erase of data is performed in units of a block BLK, the write operation and the read operation of data may be performed for each page or for each cell unit CU.

Figure 6:
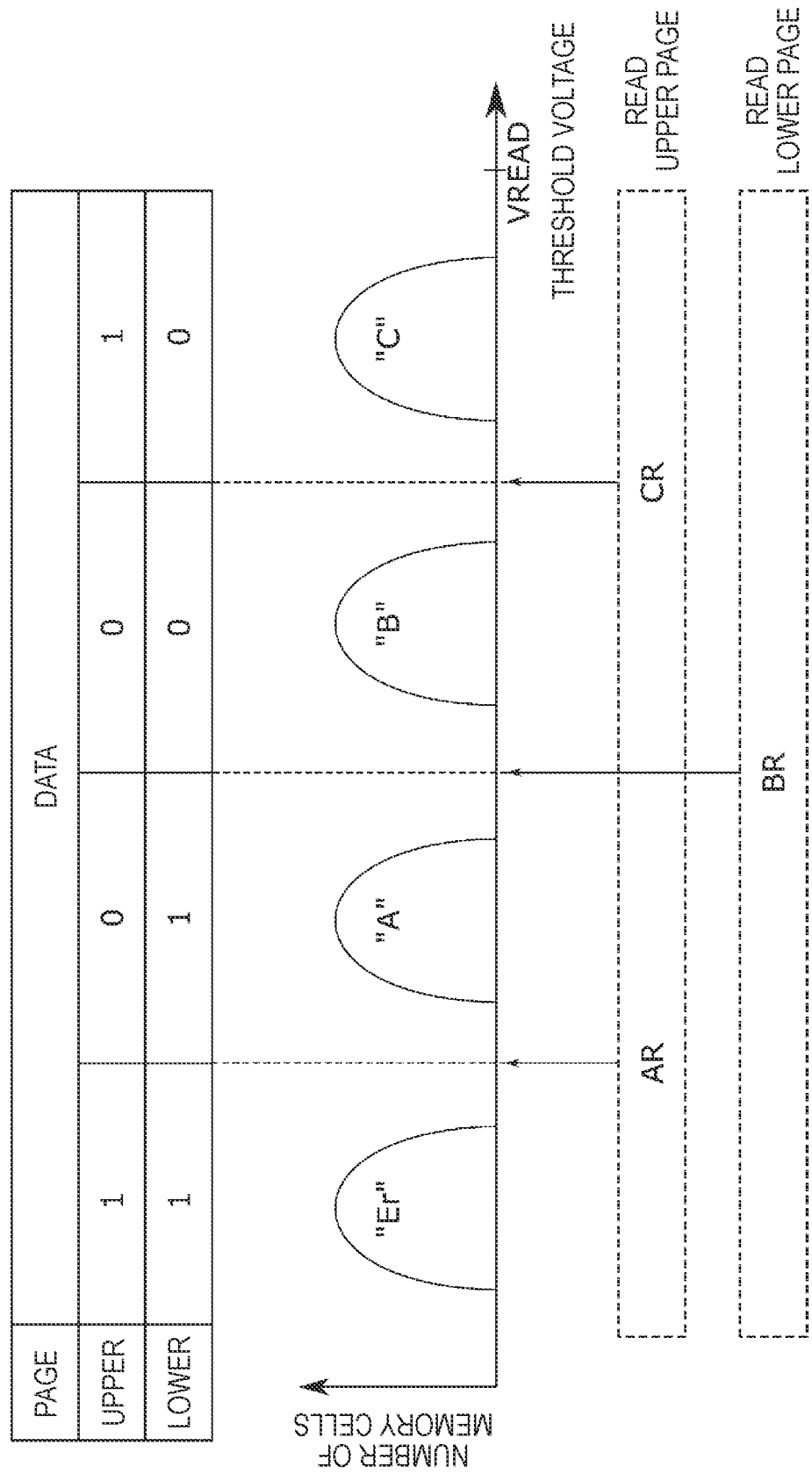
FIG. 6 is a diagram illustrating a relationship between threshold voltage distributions of memory cell transistors of the semiconductor memory device according to the first embodiment and read voltages.

FIG. 6 is a diagram illustrating a relationship between threshold voltage distributions of the memory cell transistors according to the first embodiment, and read voltages.

As described above, each memory cell transistor MT is capable of storing 2-bit data. That is, the memory cell transistor MT may take four states according to threshold voltages. The four states will be referred to as an "Er" state, an "A" state, a "B" state, and a "C" state in order from the state having the lowest threshold voltage.

The threshold voltage of the memory cell transistor MT in the "Er" state is lower than a read voltage AR, and corresponds to the erase state of data. The threshold voltage of the memory cell transistor MT in the "A" state is equal to or higher than the read voltage AR and lower than a read voltage BR (>AR). The threshold voltage of the memory cell transistor MT in the "B" state is equal to or higher than the read voltage BR and lower than a read voltage CR (>BR). The threshold voltage of the memory cell transistor MT in the "C" state is equal to or higher than the read voltage CR and lower than a voltage VREAD (>CR). Among the four states distributed as described above, the "C" state has the highest threshold voltage. The read voltages AR to CR are also called read voltages VCGR, and are used for the read operation. The voltage VREAD is a voltage applied to a word line WL which is not a target of a read, for example, during the read operation, and turns on a memory cell transistor MT, regardless of stored data.

The threshold voltage distributions are implemented by writing 2-bit (2 pages) data that are made up by the above-described lower bit and upper bit. Below is the relationship between the "Er" state to the "C" state and the lower bit/the upper bit.

"Er" state: "11" (indicated in an order of "upper/lower")
"A" state: "01"
"B" state: "00"
"C" state: "10"

In this way, only one of the two bits changes between data that correspond to two adjacent states in the threshold voltage distributions.

Accordingly, when the lower bit is read, a voltage that corresponds to the boundary of the change of the lower bit value ("0" or "1") may be used, and this applies to the upper bit.

That is, as illustrated in FIG. 6, when data of the lower page is read, the voltage BR that distinguishes the "A" state and the "B" state from each other is used as a read voltage, and it is determined whether a threshold voltage of a memory cell transistor MT is lower than the voltage BR (i.e., equal to or higher than the voltage BR).

When data of the upper page is read, the voltage AR that distinguishes the "Er" state and the "A" state from each other and the voltage CR that distinguishes the "B" state and the "C" state from each other are used as read voltages. Then, it is determined whether a threshold voltage of a memory cell transistor MT is lower than the voltage AR or equal to or higher than the voltage CR (i.e., equal to or higher than the voltage AR and lower than the voltage CR).

1.1.6 Row Decoder Module

Figure 7:
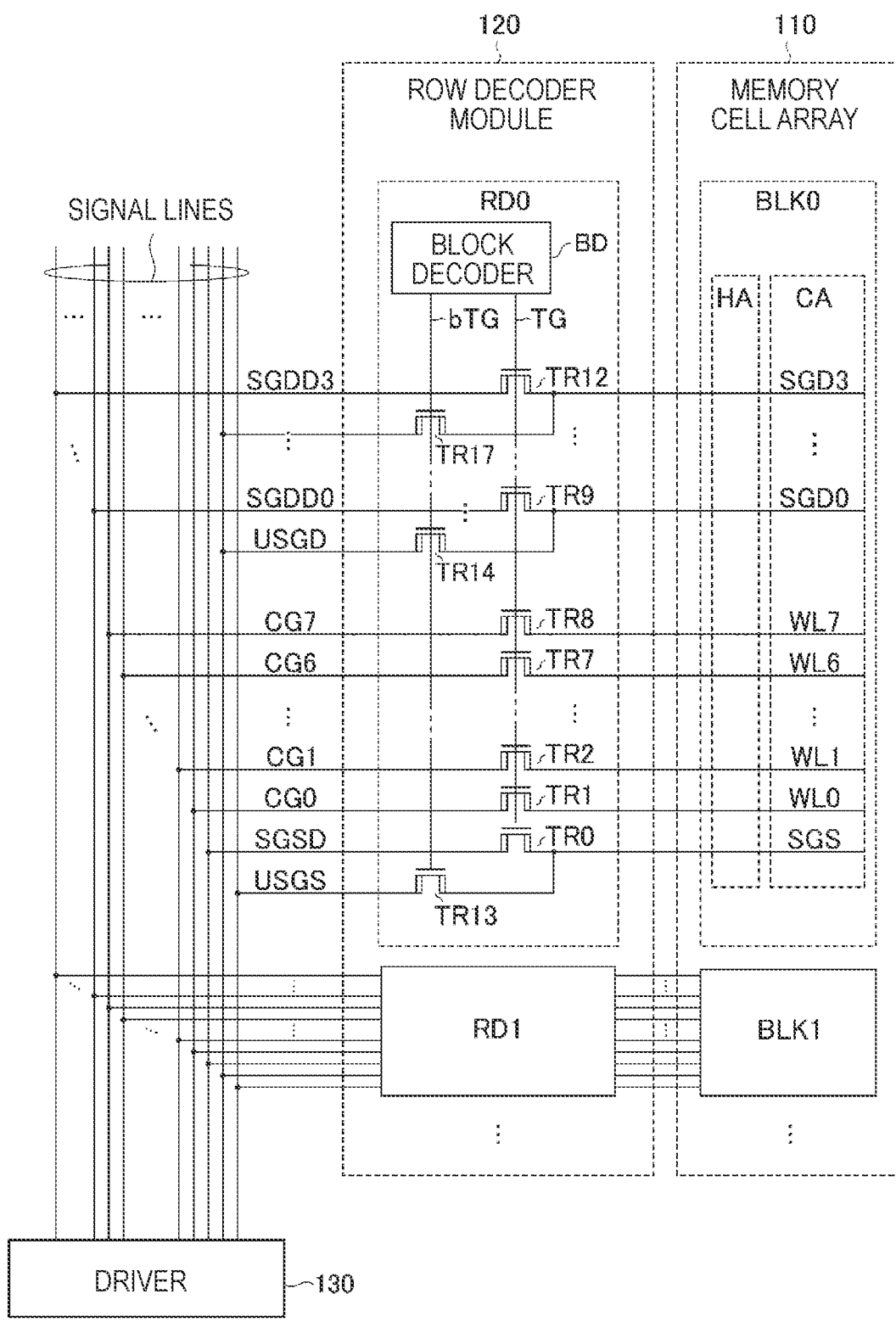
FIG. 7 is a block diagram illustrating a configuration of a row decoder module of the semiconductor storage device according to the first embodiment.

FIG. 7 is a circuit diagram illustrating a configuration of the row decoder module of the semiconductor storage device according to at least one embodiment. As illustrated in FIG. 7, the row decoder module 120 is connected to the driver 130 via, for example, signal lines CG0 to CG7, SGDD0 to SGDD3, SGSD, USGD, and USGS.

The row decoder module 120 includes, for example, row decoders RD that correspond to the blocks BLK. Hereinafter, descriptions will be made focusing on a row decoder RD0 that corresponds to the block BLK0, and the row decoders RD that correspond to the other blocks BLK have the same configuration as that of the row decoder RD0. The row decoder RD0 includes, for example, a block decoder BD, transfer gate lines TG and bTG, and transistors TR0 to TR17.

The block decoder BD decodes the block address BAd. Then, the block decoder BD applies a predetermined voltage to each of the transfer gate lines TG and bTG based on the decoding result. The voltage applied to the transfer gate line TG and the voltage applied to the transfer gate line bTG have a complementary relationship. In other words, an inversion signal of the transfer gate line TG is input to the transfer gate line TGb.

Each of the transistors TR0 to TR17 is a high-breakdown-voltage N-type MOS transistor. The respective gates of the transistors TR0 to TR12 are connected in common to the transfer gate line TG. The respective gates of the transistors TR13 to TR17 are connected in common to the transfer gate line bTG. In addition, each transistor TR is connected between a signal line wired from the driver 130 and a wiring provided in the corresponding block BLK.

Specifically, the drain of the transistor TR0 is connected to the signal line SGSD. The source of the transistor TR0 is connected to the select gate line SGS of the cell area CA via the hookup area HA. The drains of the transistors TR1 to TR8 are connected to the signal lines CG0 to CG7, respectively. The sources of the transistors TR1 to TR8 are connected to the word lines WL0 to WL7 of the cell area CA, respectively, via the hookup area HA. The drains of the transistors TR9 to TR12 are connected to the signal lines SGDD0 to SGDD3, respectively. The sources of the transistors TR9 to TR12 are connected to the select gate lines SGD0 to SGD3, respectively, via the hookup area HA.

The drain of the transistor TR13 is connected to the signal line USGS. The source of the transistor TR13 is connected to the select gate line SGS. The respective drains of the transistors TR14 to TR17 are connected in common to the signal line USGD. The sources of the transistors TR14 to TR17 are connected to the select gate lines SGD0 to SGD3, respectively.

For example, the signal lines CG0 to CG7 function as global word lines, and the word lines WL0 to WL7 function as local word lines. Further, the signal lines SGDD0 to SGDD3 and SGSD function as global transfer gate lines, and the select gate lines SGD0 to SGD3 and SGS function as local transfer gate lines.

With the configuration described above, the row decoder module 120 is able to select a block BLK. Specifically, during various operations, a block decoder BD that corresponds to a selected block BLK applies voltages of "H" and "L" levels to the transfer gate lines TG and bTG, respectively, and a block decoder BD that corresponds to a non-selected block BLK applies voltages of "L" and "H" levels to the transfer gate lines TG and bTG, respectively.

The circuit configuration of the row decoder module 120 described above is merely an example, and may be appropriately changed. For example, the number of transistors TR in the row decoder module 120 may be designed based on the number of wirings provided in each block BLK.

1.1.7 Sense Amplifier Module

Figure 8:
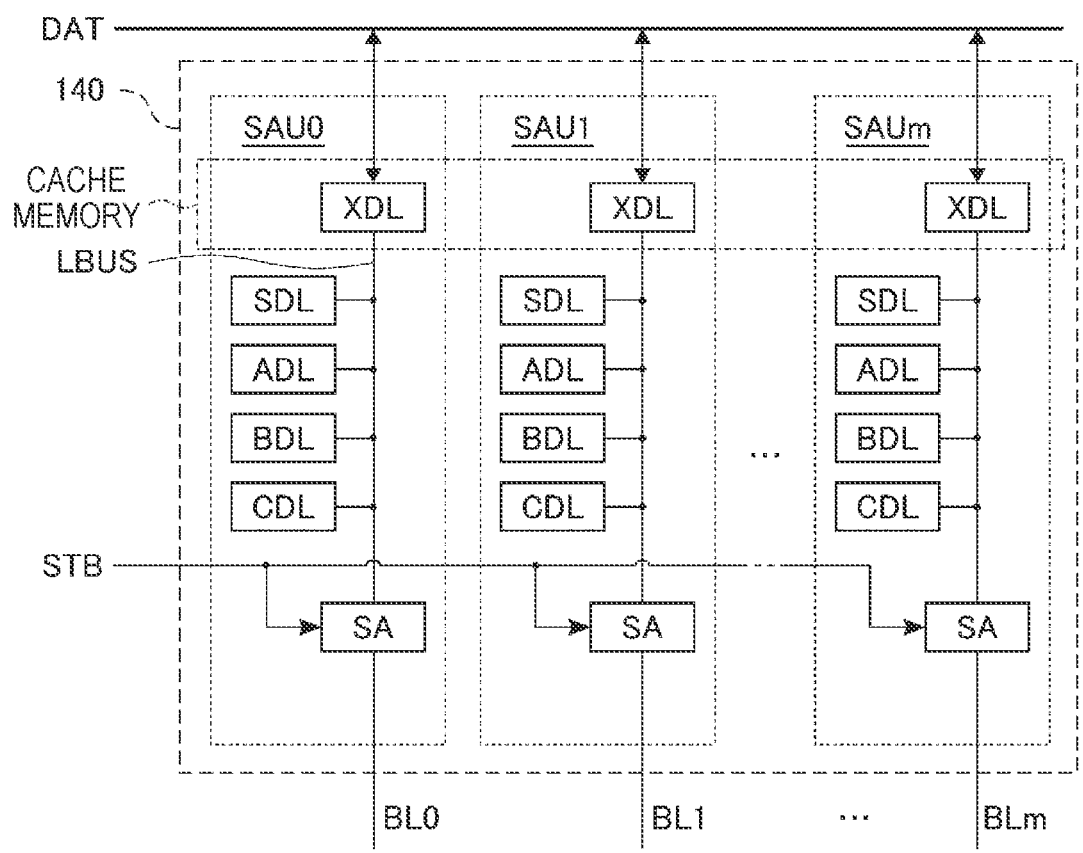
FIG. 8 is a block diagram illustrating a configuration of a sense amplifier module of the semiconductor storage device according to the first embodiment.

FIG. 8 is a circuit diagram illustrating a configuration of a sense amplifier module of the semiconductor storage device according to the first embodiment. As illustrated in FIG. 8, the sense amplifier module 140 includes a plurality of sense amplifier units SAU that are provided in association with the bit lines BL, respectively. Each sense amplifier unit SAU includes, for example, a sense amplifier SA and latch circuits SDL, ADL, BDL, CDL, and XDL.

The sense amplifier SA, a logic circuit LC, and the latch circuits SDL, ADL, BDL, CDL, and XDL are connected in common to a bus LBUS. The latch circuits SDL, ADL, BDL, CDL, and XDL are capable of transmitting/receiving data to/from each other.

A strobe signal STB generated by, for example, the sequencer 170 is input to each sense amplifier SA. Then, the sense amplifier SA senses whether a threshold voltage of a selected memory cell transistor MT is equal to or higher than the read voltage, based on the timing when the strobe signal STB is asserted. That is, the sense amplifier SA reads data stored in the selected memory cell transistor MT via the bit line BL.

The latch circuits SDL, ADL, BDL, CDL, and XDL temporarily store data. The latch circuit XDL is used for the input/output of data DAT between the input/output circuit of the semiconductor storage device 100 and the sense amplifier unit SAU. The latch circuit XDL may also be used, for example, as a cache memory of the semiconductor storage device 100. The semiconductor storage device 100 may enter the ready state when at least the latch circuit XDL is available.

1.2 Read Operation

Hereinafter, a read operation in the semiconductor storage device according to the first embodiment will be described.

Figure 9:
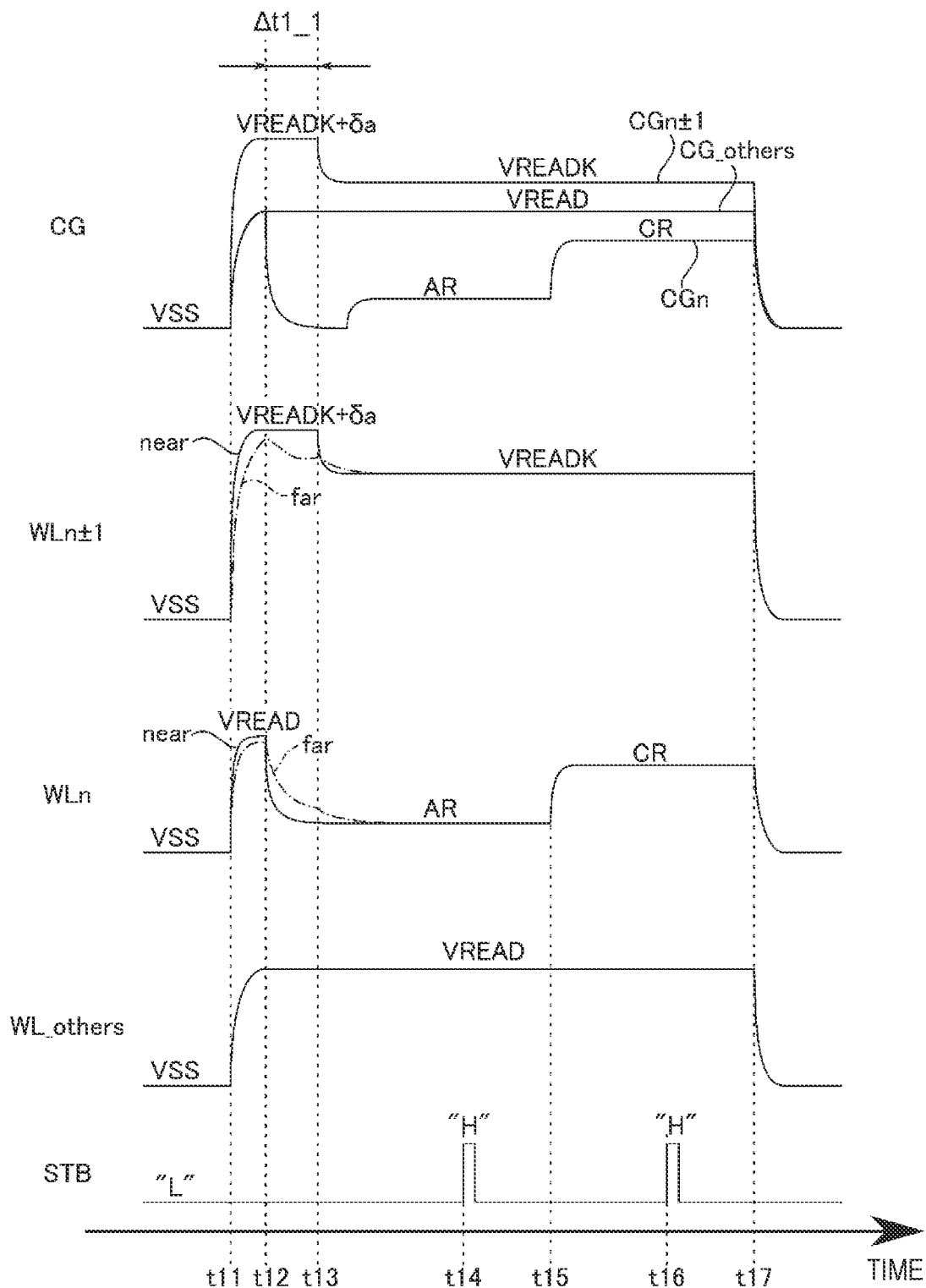
FIG. 9 is a timing chart illustrating a read operation of an upper page in the semiconductor storage device according to the first embodiment.
Figure 10:
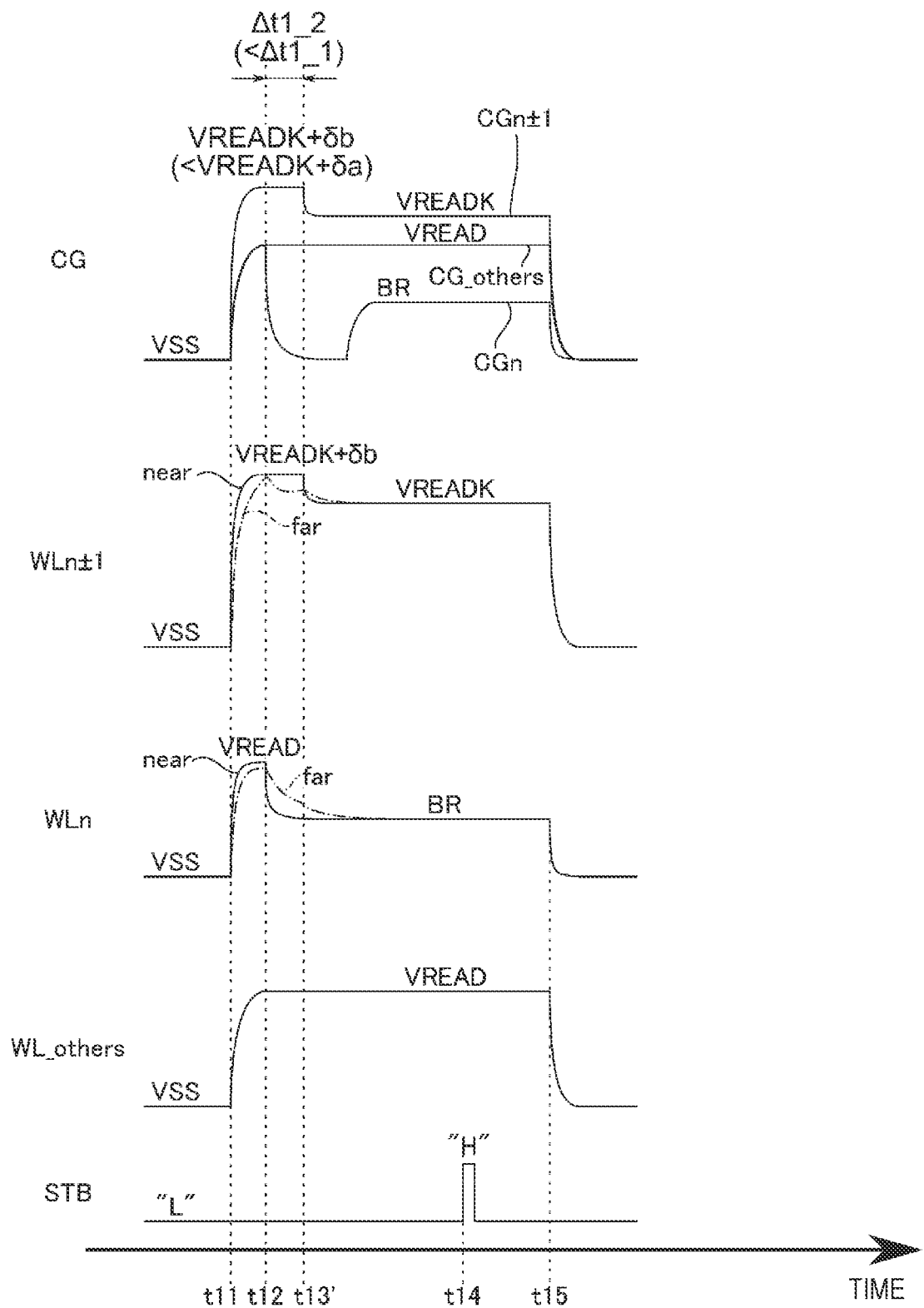
FIG. 10 is a timing chart illustrating a read operation of a lower page in the semiconductor storage device according to the first embodiment.

FIGS. 9 and 10 are timing charts illustrating the read operation in the semiconductor storage device according to the first embodiment. FIGS. 9 and 10 illustrate time-varying waveforms of the word lines WL, the signal lines CG, and the strobe signal, when data of each of the upper page and the lower page is read from the memory cell transistors MT within the string unit SU0.

In FIGS. 9 and 10, a word line WL connected to a memory cell transistor MT to be read will be referred to as a selected word line WLn, and word lines WL other than the selected word line WLn will be referred to as non-selected word lines WL. Among the non-selected word lines WL, a word line WL adjacent to the selected word line WLn will be referred to as a non-selected word line WL(n±1) which is distinguished from all of the other non-selected word lines WL_others. Further, the signal lines CG for supplying voltages to the selected word line WLn and the non-selected word lines WL(n±1) and WL_others will be referred to as signal lines CGn, CG(n±1), and CG_others, respectively.

As described above, the portion of a word line WL in the area "far" is affected by the larger parasitic capacitance than that in the portion of the word line WL in the area "near." Thus, while the portion of the word line WL in the area "near" is able to quickly respond to the voltage transferred from the row decoder module 120, the portion of the word line WL in the area "far" may respond to the voltage later than the portion of the word line WL in the area "near." In FIGS. 9 and 10, the waveforms of the portions of the selected word line WLn and the non-selected word line WL(n±1) that correspond to the areas "near" and "far" are distinguishably illustrated by a solid line and an alternate long and short dashed line, respectively.

First, the read operation of the upper page will be described with reference to FIG. 9.

As illustrated in FIG. 9, at a timing t11, the driver 130 applies the voltage VREAD to the signal lines CGn and CG_others, and applies a voltage VREADK+δa to the signal line CG (n±1). The voltage VREADK is higher than the voltage VREAD, and is a voltage for surely turning on the non-selected memory cell transistor MT(n±1). In the read operation of the upper page according to at least one embodiment, a voltage which is higher than the voltage VREADK by the increment of δa is applied to the signal line CG(n±1). The increment δa is a constant determined in advance according to the voltage difference between the read voltage AR applied first in the read operation of the upper page and the voltage VREAD.

The row decoder module 120 turns on the transistors TR0 to TR9, and transfers the voltages of the signal lines SGSD, CG0 to CG7, and SGDD0 to the select gate line SGS, the word lines WL0 to WL7, and the select gate line SGD0, respectively. As a result, the voltage VREAD is transferred to the selected word line WLn and the non-selected word lines WL_others, and the voltage VREADK+δa is transferred to the non-selected word line WL(n±1). As described above, in the area "near," the voltages VREAD and VREADK+δa are quickly transferred to the selected word line WLn and the non-selected word line WL(n±1), respectively. Meanwhile, in the area "far," the voltages VREAD and VREADK+δa are transferred later (with a relatively large time constant) than those in the area "near."

At a timing t12, the driver 130 maintains the application of the voltages VREADK+δa and VREAD to the signal lines CG (n±1) and CG_others, while applying the read voltage AR to the signal line CGn. As a result, the row decoder module 120 transfers the voltages AR, VREADK+δa, and VREAD to the selected word line WLn and the non-selected word lines WL(n±1) and WL_others, respectively.

Since the non-selected word line WL(n±1) quickly responds to the voltage transferred from the signal line CG(n±1) in the region "near," the non-selected word line WL(n±1) is not substantially affected by the voltage AR transferred to the selected word line WLn, and maintains the voltage VREADK+δa. Meanwhile, the voltage of the non-selected word line WL(n±1) may decrease in the area "far" due to the coupling with the selected word line WLn to which the voltage AR is transferred. However, the increment δa is preset to be larger than the amount of decrease in voltage of the non-selected word line WL(n±1) caused from the coupling with the selected word line WLn. As a result, the non-selected word line WL(n±1) may maintain the voltage higher than the voltage VREADK, even though the non-selected word line WL(n±1) is affected by the coupling with the selected word line WLn.

In the area "near," the selected word line WLn quickly responds to the voltage transferred from the signal line CGn, and reaches the voltage AR. Meanwhile, in the area "far," the convergence of the voltage of the selected word line WLn to the voltage AR is delayed due to the parasitic capacitance between the wiring resistance of the selected word line WLn itself and the non-selected word line WL(n±1), and thus, the selected word line WLn reaches a voltage higher than the voltage AR.

At a timing t13, the driver 130 maintains the application of the voltages AR and VREAD to the signal lines CGn and CG_others, while applying the voltage VREADK to the signal line CG(n±1). As a result, the row decoder module 120 transfers the voltages AR, VREADK, and VREAD to the selected word line WLn and the non-selected word lines WL(n±1) and WL_others, respectively.

As described above, in the area "far," both the voltages of the selected word line WLn and the non-selected word line WL(n±1) are higher than their target values, that is, the voltages AR and VREADK, and thus, tend to decrease toward the respective target values. Accordingly, as compared to a case where the voltages of the word lines change in opposite directions (e.g., when the voltage of the selected word line WLn tends to decrease, whereas the voltage of the non-selected word line WL(n±1) tends to increase), the amount of change in voltage between the selected word line WLn and the non-selected word line WL(n±1) is small, and the influence of coupling may be reduced. Thus, it is possible to expedite (assist) the convergence of the voltages of the selected word line WLn and the non-selected word line WL(n±1) in the area "far" after the timing t13 to the target values.

The period Δt1_1 (=t13−t12) is set according to the voltage difference between the read voltage AR and the voltage VREAD, in order to efficiently expedite the convergence of the voltage of the non-selected word line WL (n±1) in the area "far" to the target value voltage VREADK. For example, the timing t13 may be set to a timing at which a difference between the voltage of the non-selected word line WL (n±1) in the area "far" and the target value VREADK and a difference between the voltage of the selected word line WLn in the area "far" and the target value AR are equal to each other. As a result, the influence of the coupling between the non-selected word line WL(n±1) and the selected word line WLn after the timing t13 may be minimized.

At a timing t14, the sequencer 170 asserts a first strobe signal in the read operation of the upper page. The sense amplifier module 140 senses whether the threshold voltage of the selected memory cell transistor MT is equal to or higher than the voltage AR. The sense amplifier module 140 stores the sensing result in the latch circuit ADL.

At a timing t15, the driver 130 applies the voltage CR to the signal line CGn. As a result, the row decoder module 120 transfers the voltage CR to the selected word line WLn.

At a timing t16, the sequencer 170 asserts a second strobe signal in the read operation of the upper page. The sense amplifier module 140 senses whether the threshold voltage of the selected memory cell transistor MT is equal to or higher than the voltage CR. The sense amplifier module 140 stores the sensing result in the latch circuit BDL. The sense amplifier module 140 reads the data stored in the upper page of the selected memory cell transistor MT as read data, based on the sensing results stored in the latch circuits ADL and BDL.

At a timing t17, the driver 130 applies a voltage VSS to the signal lines CGn, CG(n±1), and CG_others. As a result, the row decoder module 120 transfers the voltage VSS to the selected word line WLn, and the non-selected word lines WL(n±1) and WL_others.

Then, the read operation of the upper page ends.

Next, the read operation of the lower page will be described with reference to FIG. 10, for example.

As illustrated in FIG. 10, at a timing t11, the driver 130 applies the voltage VREAD to the signal lines CGn and CG_others, and applies the voltage VREADK+δb to the signal line CG(n±1). In the read operation of the lower page according to at least one embodiment, a voltage which is higher than the voltage VREADK by the increment δb is applied to the signal line CG(n±1). The increment δb is a constant determined in advance according to the voltage difference between the read voltage BR applied first in the read operation of the lower page and the voltage VREAD, and is smaller than the increment δa (δb<δa). The increment of the voltage applied to the signal line CG(n±1) at the timing t11 from the voltage VREADK may correlate with, for example, the magnitude of the voltage difference between the voltage applied to the selected word line WLn when the strobe signal is applied first in the read operation, and the voltage VREAD.

The row decoder module 120 turns on the transistors TR0 to TR9, and transfers the voltages of the signal lines SGSD, CG0 to CG7, and SGDD0 to the select gate line SGS, the word lines WL0 to WL7, and the select gate line SGD0, respectively. As a result, the voltage VREAD is transferred to the selected word line WLn and the non-selected word lines WL_others, and the voltage VREADK+δb is transferred to the non-selected word line WL(n±1). As described above, in the area "near," the voltages VREAD and VREADK+δb are quickly transferred to the selected word line WLn and the non-selected word line WL (n±1), respectively. Meanwhile, in the area "far," the voltages VREAD and VREADK+δb are transferred later (with a relatively large time constant) than those in the area "near."

At a timing t12, the driver 130 maintains the application of the voltages VREADK+δb and VREAD to the signal lines CG (n±1) and CG_others, while applying the read voltage BR to the signal line CGn. As a result, the row decoder module 120 transfers the voltages BR, VREADK+δb, and VREAD to the selected word line WLn and the non-selected word lines WL(n±1) and WL_others, respectively.

Since the non-selected word line WL(n±1) quickly responds to the voltage transferred from the signal line CG(n±1) in the area "near," the non-selected word line WL(n±1) is not substantially affected by the voltage BR transferred to the selected word line WLn, and maintains the voltage VREADK+δb. Meanwhile, the voltage of the non-selected word line WL (n±1) may decrease in the area "far" due to the coupling with the selected word line WLn to which the voltage BR is transferred. The increment δb, however, is preset to be larger than the amount of decrease in voltage of the non-selected word line WL(n±1) caused from the coupling with the selected word line WLn. As a result, the non-selected word line WL(n±1) may maintain the voltage higher than the voltage VREADK, even though the non-selected word line WL(n±1) is affected by the coupling with the selected word line WLn.

The voltage BR is higher than the voltage AR. Thus, the amount of change from the voltage VREAD to the voltage BR is smaller than the amount of change from the voltage VREAD to the voltage AR. Thus, the magnitude of the coupling that the non-selected word line WL(n±1) receives from the selected word line WLn in the area "far" is smaller than that in the read operation of the upper page illustrated in FIG. 9. Accordingly, even though the increment δb is set to a value smaller than the increment δa, the non-selected word line WL(n±1) may maintain the voltage higher than the voltage VREADK while being affected by the coupling with the selected word line WLn.

In the area "near," the selected word line WLn quickly responds to the voltage transferred from the signal line CGn, and reaches the voltage BR. Meanwhile, in the area "far," the convergence of the voltage of the selected word line WLn to the voltage BR is delayed due to the parasitic capacitance between the wiring resistance of the selected word line WLn itself and the non-selected word line WL(n±1), and thus, the selected word line WLn reaches a voltage higher than the voltage BR.

At a timing t13', the driver 130 maintains the application of the voltages BR and VREAD to the signal lines CGn and CG_others, while applying the voltage VREADK to the signal line CG(n±1). As a result, the row decoder module 120 transfers the voltages BR, VREADK, and VREAD to the selected word line WLn and the non-selected word lines WL(n±1) and WL_others, respectively.

In the area "far," both the voltages of the selected word line WLn and the non-selected word line WL (n±1) are higher than their target values, that is, the voltages BR and VREADK, and thus, tend to decrease toward the respective target values. Accordingly, as compared to a case where the voltages of the word lines change in opposite directions, the amount of change in voltage between the selected word line WLn and the non-selected word line WL(n±1) is small, and the influence of the coupling may be reduced. Thus, it is possible to expedite (assist) the convergence of the voltages of the selected word line WLn and the non-selected word line WL(n±1) in the area "far" after the timing t13' to the target values.

The period Δt1-2 (=t13'–t12) is set to an appropriate value according to the magnitude of the difference between the read voltage BR and the voltage VREAD. For example, the timing t13' may be set to a timing at which a difference between the voltage of the non-selected word line WL(n±1) in the area "far" and the target value VREADK and a difference between the voltage of the selected word line WLn in the area "far" and the target value BR are equal to each other. Thus, the period Δt1-2 is set to a value different from the period Δt1_1. Since the read voltage BR is higher than the read voltage AR, the example of FIG. 10 illustrates a case where the period Δt1_2 is set to be shorter than the period Δt1_1.

At a timing t14, the sequencer 170 asserts a first strobe signal in the read operation of the lower page. The sense amplifier module 140 senses whether the threshold voltage of the selected memory cell transistor MT is equal to or higher than the voltage BR. The sense amplifier module 140 stores the sensing result in the latch circuit ADL. The sense amplifier module 140 reads the data stored in the lower page of the selected memory cell transistor MT as read data, based on the sensing result stored in the latch circuit ADL.

At a timing t15, the driver 130 applies the voltage VSS to the signal lines CGn, CG(n±1), and CG_others. As a result, the row decoder module 120 transfers the voltage VSS to the selected word line WLn and the non-selected word lines WL(n±1) and WL_others.

Then, the read operation of the lower page ends.

1.3 Effects of First Embodiment

According to the first embodiment, the row decoder module 120 applies a voltage higher than the voltage VREADK to the non-selected word line WL(n±1). Subsequently, after the read voltage VCGR is applied first to the selected word line WLn, the row decoder module 120 applies the voltage VREADK to the non-selected word line WL(n±1). As a result, the voltage of the non-selected word line WL(n±1) may be prevented from becoming lower than the voltage VREADK due to the coupling when the voltage of the selected word line WLn decreases from the voltage VREAD to the read voltage VCGR. Thus, in the area "far," the direction of change in which the voltage of the non-selected word line WL(n±1) approaches the voltage VREADK may be made identical to the direction of change in which the voltage of the selected word line WLn approaches the read voltage VCGR (the decreasing direction). Accordingly, the amount of change in voltage between the non-selected word line WL(n±1) and the selected word line WLn may be reduced, so that the voltage of the selected word line WLn and the voltage of the non-selected word line WL(n±1) may quickly converge to the voltages AR and VREADK, respectively, while reducing the influence of the coupling.

The increment δ (δa or δb) from the voltage VREADK applied to the non-selected word line WL(n±1) in the read operation is set according to the voltage difference between the read voltage VCGR applied first and the voltage VREAD. In the read operation, the period Δt (Δt1-1 or Δt1_2) from the application of the read voltage VCGR to the selected word line WLn to the application of the voltage VREADK to the non-selected word line WL(n±1) is set according to the voltage difference between the read voltage VCGR applied first and the voltage VREAD. Specifically, the increment δb from the voltage VREADK in the read operation of the lower page is smaller than the increment δa from the voltage VREADK in the read operation of the upper page. Further, the period Δt1_2 in the read operation of the lower page is shorter than the period Δt1_1 in the read operation of the upper page. That is, the increment δ and the period Δt correlate with the voltage difference between the read voltage VCGR for asserting the first strobe signal and the voltage VREAD. As a result, the increment δ and the period Δt may be adaptively set according to the magnitude of the influence of the coupling that the non-selected word line WL(n±1) receives from the selected word line WLn, so that the time until the voltage of the selected word line WLn and the voltage of the non-selected word line WL(n±1) converge to the voltages AR and VREADK, respectively, may be optimized.

2. Second Embodiment

Next, a semiconductor storage device according to a second embodiment will be described. The first embodiment, according to at least one embodiment, provides a case where in the read operation of reading data using a plurality of read voltages, the voltages are applied to the selected word line WLn in order from the lowest read voltage. Meanwhile, the second embodiment is different from the first embodiment in that in the read operation of reading data using a plurality of read voltages, the voltages are applied to the selected word line WLn in order from the highest read voltage. Hereinafter, descriptions of the configuration and operation similar to those in the first embodiment will be omitted, and the configuration and operation different from those in the first embodiment will be mainly described.

2.1 Read Operation

Figure 11:
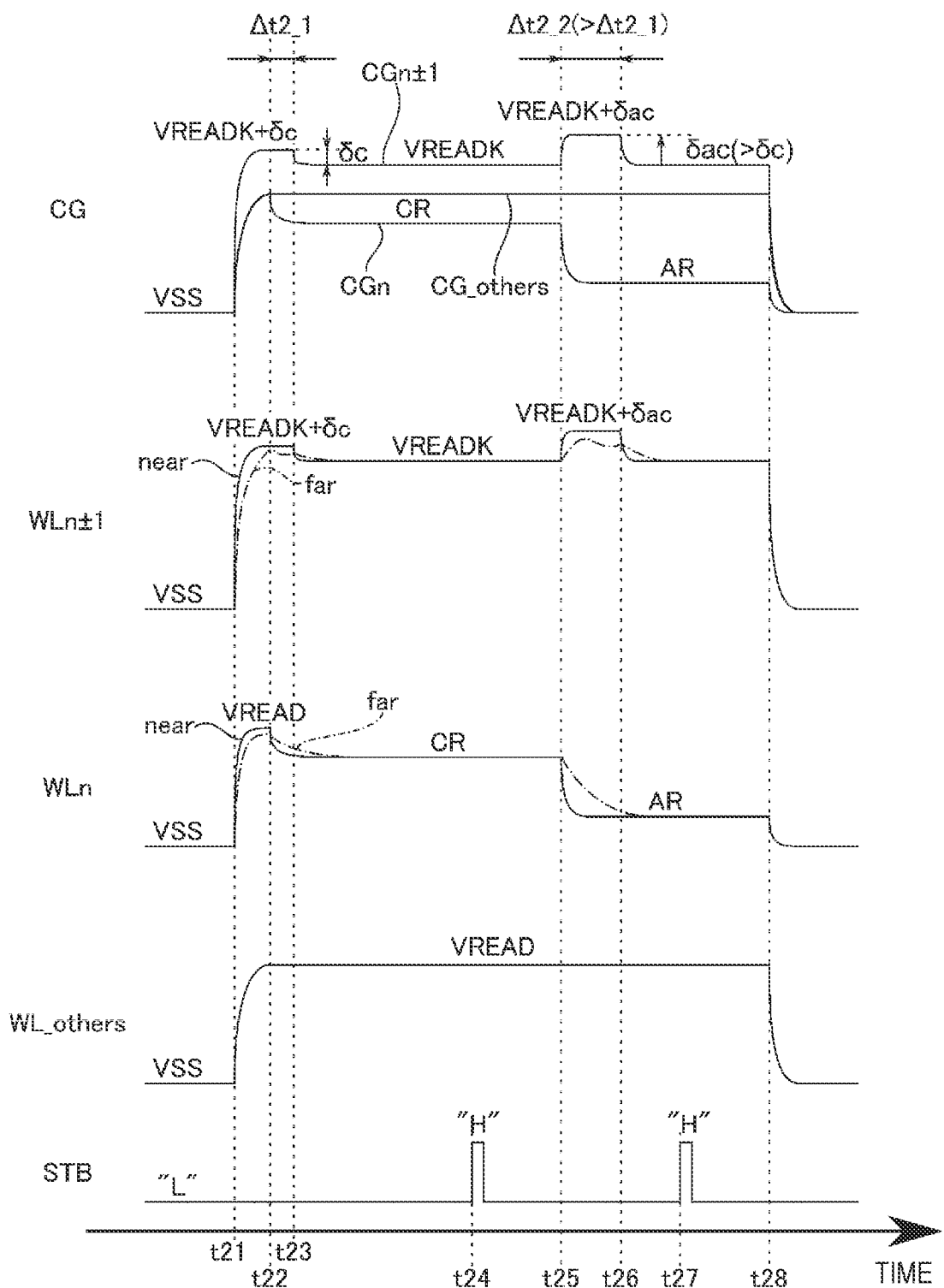
FIG. 11 is a timing chart illustrating a read operation of an upper page in a semiconductor storage device according to a second embodiment.

FIG. 11 is a timing chart illustrating the read operation of the upper page in the semiconductor storage device of the second embodiment, and corresponds to FIG. 9 of the first embodiment.

As illustrated in FIG. 11, at a timing t21, the driver 130 applies the voltage VREAD to the signal lines CGn and CG_others, and applies the voltage VREADK+δc to the signal line CG(n±1). In the read operation of the upper page according to at least one embodiment, a voltage which is higher than the voltage VREADK by the increment of δc is applied to the signal line CG(n±1). The increment δc is a constant determined in advance according to the voltage difference between the read voltage CR applied first in the read operation of the upper page and the voltage VREAD, and is smaller than the increment δa (δc<δa).

The row decoder module 120 turns on the transistors TR0 to TR9, and transfers the voltages of the signal lines SGSD, CG0 to CG7, and SGDD0 to the select gate line SGS, the word lines WL0 to WL7, and the select gate line SGD0, respectively. As a result, the voltage VREAD is transferred to the selected word line WLn and the non-selected word lines WL_others, and the voltage VREADK+δc is transferred to the non-selected word line WL (n±1).

The operation at the timing t21 is the same as that at the timing t11 of FIG. 9, except that the voltage VREADK+δc is applied to the non-selected word line WL(n±1).

At a timing t22, the driver 130 maintains the application of the voltages VREADK+δc and VREAD to the signal lines CG (n±1) and CG_others, while applying the read voltage CR to the signal line CGn. As a result, the row decoder module 120 transfers the voltages CR, VREADK+δc, and VREAD to the selected word line WLn and the non-selected word lines WL(n±1) and WL_others, respectively.

In the area "far," the voltage of the non-selected word line WL(n±1) decreases due to the influence of the coupling with the selected word line WLn to which the read voltage CR is transferred. However, since the increment δc is preset to be larger than the amount of decrease in voltage of the non-selected word line WL(n±1), the non-selected word line WL(n±1) maintains the voltage higher than the voltage VREADK even though the non-selected word line WL(n±1) is affected by the coupling with the selected word line WLn.

At a timing t23, the driver 130 maintains the application of the voltages CR and VREAD to the signal lines CGn and CG_others, while applying the voltage VREADK to the signal line CG(n±1). Further, the row decoder module 120 transfers the voltages CR, VREADK, and VREAD to the selected word line WLn and the non-selected word lines WL(n±1) and WL_others, respectively.

In the area "far," both the voltages of the selected word line WLn and the non-selected word line WL(n±1) tend to decrease toward their respective target values. Thus, as compared to a case where the voltages of the word lines change in opposite directions, the amount of change in voltage between the selected word line WLn and the non-selected word line WL(n±1) is small, so that the influence of coupling may be reduced. Accordingly, it is possible to expedite (assist) the convergence of the voltages of the selected word line WLn and the non-selected word line WL(n±1) in the area "far" after the timing t23 to the target values.

The period Δt2_1 (=t23−t22) is set to an appropriate value according to the magnitude of the difference between the read voltage CR and the voltage VREAD. For example, the timing t23 may be set to a timing at which a difference between the voltage of the non-selected word line WL (n±1)

in the area "far" and the target value VREADK and a difference between the voltage of the selected word line WLn in the area "far" and the target value CR are equal to each other.

At a timing t24, the sequencer 170 asserts a first strobe signal in the read operation of the upper page. The sense amplifier module 140 senses whether the threshold voltage of the selected memory cell transistor MT is equal to or higher than the voltage CR. The sense amplifier module 140 stores the sensing result in the latch circuit ADL.

At a timing t25, the driver 130 applies a voltage VREADK+δac to the signal line CG(n±1), while applying the voltage AR to the signal line CGn. The increment δac is a constant determined in advance according to the voltage difference between the read voltage CR applied first and the read voltage AR applied second time in the read operation of the upper page. For example, when the voltage difference between the read voltages CR and AR is larger than the voltage difference between the read voltage CR and the voltage VREAD, the increment δac is set to a value larger than the increment δc. The row decoder module 120 transfers the voltages AR and VREADK+δac to the selected word line WLn and the non-selected word line WL(n±1), respectively.

In the area "far," the voltage of the non-selected word line WL(n±1) may decrease due to the coupling with the selected word line WLn to which the read voltage AR is transferred. However, the increment δac is preset to be larger than the amount of decrease in voltage of the non-selected word line WL(n±1) caused from the coupling with the selected word line WLn. As a result, the non-selected word line WL(n±1) may maintain the voltage higher than the voltage VREADK, even though the non-selected word line WL(n±1) is affected by the coupling with the selected word line WLn.

The timing at which the voltage VREADK+δac is applied to the signal line CG(n±1) may be a timing before the timing t25 as long as the sense amplifier module 140 has sensed whether the threshold voltage of the selected memory cell transistor MT is equal to or higher than the voltage CR.

At a timing t26, the driver 130 maintains the application of the voltages AR and VREAD to the signal lines CGn and CG_others, while applying the voltage VREADK to the signal line CG(n±1). As a result, the row decoder module 120 transfers the voltages AR, VREADK, and VREAD to the selected word line WLn and the non-selected word line WL(n±1) and WL_others, respectively.

In the area "far," both the voltages of the selected word line WLn and the non-selected word line WL(n±1) tend to decrease toward their respective target values. Thus, as compared to a case where the voltages of the word lines change in opposite directions, the amount of change in voltage between the selected word line WLn and the non-selected word line WL(n±1) is small, so that the influence of the coupling may be reduced. Accordingly, it is possible to expedite (assist) the convergence of the voltages of the selected word line WLn and the non-selected word line WL(n±1) in the area "far" after the timing t26 to the target values.

The period Δt2_2 (=t26−t25) is set to an appropriate value according to the magnitude of the difference between the read voltages CR and AR. For example, the timing t26 may be set to a timing at which a difference between the voltage of the non-selected word line WL(n±1) in the area "far" and the target value VREADK and a difference between the voltage of the selected word line WLn in the area "far" and the target value AR are equal to each other. Thus, the period Δt2_2 is set to a value different from the period Δt2_1. Since it is assumed that the voltage difference between the read voltages CR and AR is larger than the voltage difference between the voltage VREAD and the read voltage CR, the example of FIG. 11 illustrates a case where the period Δt2_2 is set to be longer than the period Δt2_1.

At a timing t27, the sequencer 170 asserts a second strobe signal in the read operation of the upper page. The sense amplifier module 140 senses whether the threshold voltage of the selected memory cell transistor MT is equal to or higher than the voltage AR. The sense amplifier module 140 stores the sensing result in the latch circuit BDL. The sense amplifier module 140 reads the data stored in the upper page of the selected memory cell transistor MT as read data, based on the sensing results stored in the latch circuits ADL and BDL.

At a timing t28, the driver 130 applies the voltage VSS to the signal lines CGn, CG(n±1), and CG_others. As a result, the row decoder module 120 transfers the voltage VSS to the selected word line WLn and the non-selected word lines WL(n±1) and WL_others.

Then, the read operation of the upper page ends.

2.2 Effects of Present Embodiment

According to the second embodiment, when the plurality of read voltages AR and CR are used for the read operation of the upper page, the increase of the time required for the read operation may also be prevented by the method of applying the voltages in order of the read voltage with the relatively higher voltage value.

After the strobe signal STB that corresponds to the read voltage CR is asserted, the row decoder module 120 increases the voltage of the non-selected word line WL(n±1) from the voltage VREADK to the voltage VREADK+δac. Subsequently, after the read voltage AR is applied a second time to the selected word line WLn, the row decoder module 120 applies the voltage VREADK again to the non-selected word line WL (n±1). As a result, the voltage of the non-selected word line WL(n±1) may be prevented from becoming lower than the voltage VREADK due to the coupling when the voltage of the selected word line WLn decreases from the read voltage CR to the read voltage AR, so that the voltage of the non-selected word line WL(n±1) may quickly converge to the voltage VREADK.

The increment δac and the period Δt2_2 are set according to the voltage difference between the read voltage CR applied first and the read voltage AR applied second time. That is, the increment δac and the period Δt2_2 correlate with the voltage difference between the read voltages CR and AR. As a result, the increment δ and the period Δt may be adaptively set according to the magnitude of the influence of the coupling that the non-selected word line WL(n±1) receives from the selected word line WLn each time the read voltage is applied.

The period during which the voltage of the non-selected word line WL (n±1) becomes higher than the voltage VREADK when the read voltage VCGR is applied to the selected word line WLn is limited to the periods Δt2_1 and Δt2_2. Thus, it is possible to prevent the application of an unnecessarily high voltage to the non-selection word line WL(n±1), and it is possible to prevent the occurrence of unintended injection of charges into the memory cell transistor MT.

3. Third Embodiment

Next, a semiconductor storage device according to a third embodiment will be described.

The second embodiment has described a case where the voltage VREADK is applied to the non-selected word line WL (n±1) when the strobe signal is asserted. The third embodiment is different from the second embodiment in that a voltage higher than the voltage VREADK may be applied to the non-selected word line WL(n±1) when the strobe signal is asserted. In the following description, description of the configuration and operation similar to those in the second embodiment will be omitted, and the configuration and operation different from those in the second embodiment will be mainly described.

3.1 Read Operation

Figure 12:
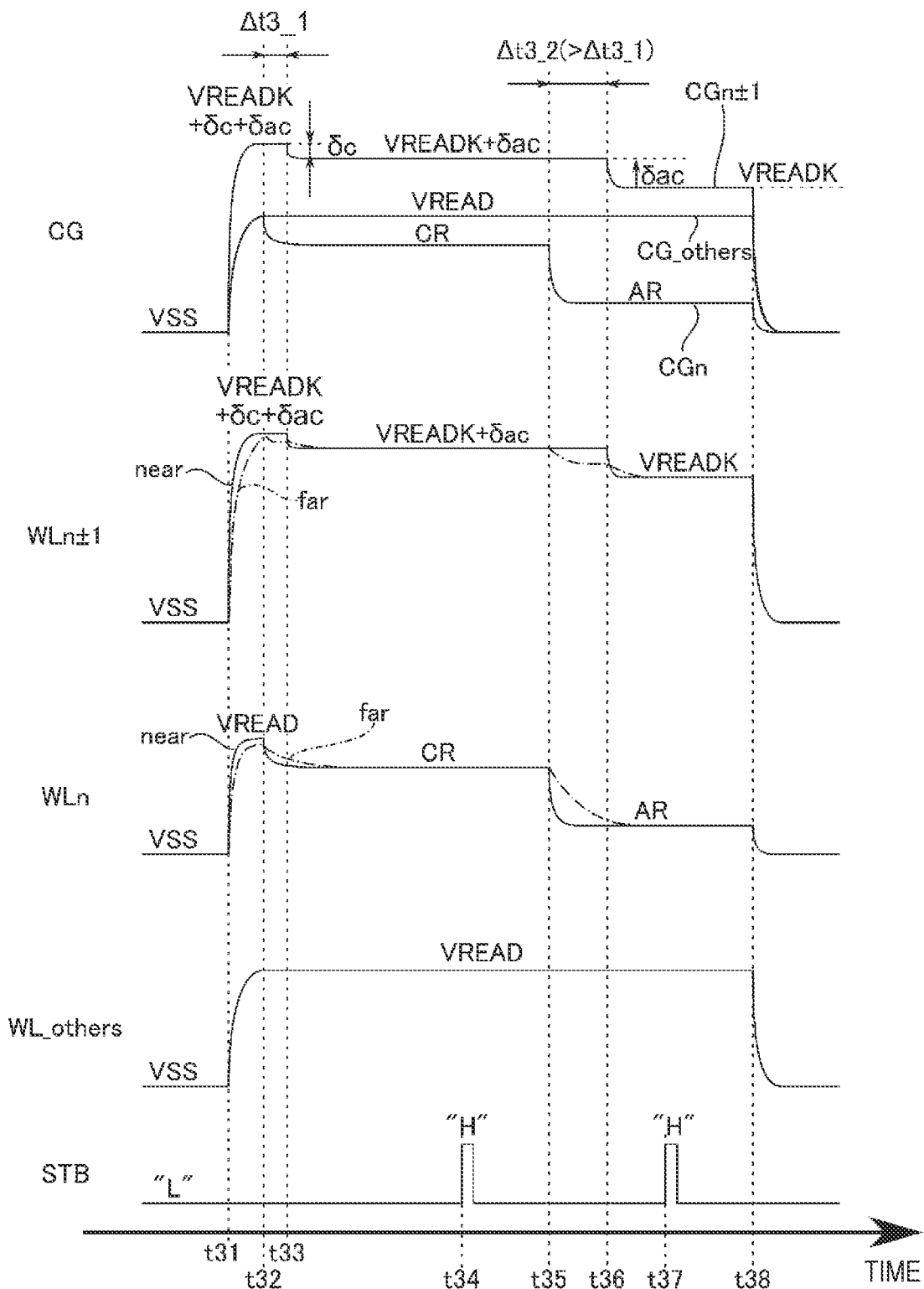
FIG. 12 is a timing chart illustrating a read operation of an upper page in a semiconductor storage device according to a third embodiment.

FIG. 12 is a timing chart illustrating the read operation of the upper page in the semiconductor storage device according to the third embodiment, and corresponds to FIG. 11 of the second embodiment.

As illustrated in FIG. 12, at a timing t31, the driver 130 applies the voltage VREAD to the signal lines CGn and CG_others, and applies a voltage VREADK+$\delta$c+$\delta$ac to the signal line CG(n±1). In the read operation of the upper page according to at least one embodiment, a voltage which is higher than the voltage VREADK+$\delta$c by the increment of $\delta$ac is applied to the signal line CG(n±1).

The row decoder module 120 turns on the transistors TR0 to TR9, and transfers the voltages of the signal lines SGSD, CG0 to CG7, and SGDD0 to the select gate lines SGS, the word lines WL0 to WL7, and the select gate line SGD0, respectively. As a result, the voltage VREAD is transferred to the selected word line WLn and the non-selected word lines WL_others, and the voltage VREADK+$\delta$c+$\delta$ac is transferred to the non-selected word line WL(n±1).

The operation at the timing t31 is the same as that at the timing t21 in FIG. 11, except that the voltage VREADK+$\delta$c+$\delta$ac is applied to the non-selected word line WL(n±1).

At a timing t32, the driver 130 maintains the application of the voltages VREADK+$\delta$c+$\delta$ac and VREAD to the signal lines CG(n±1) and CG_others, while applying the read voltage CR to the signal line CGn. As a result, the row decoder module 120 transfers the voltages CR, VREADK+$\delta$c+$\delta$ac, and VREAD to the selected word line WLn and the non-selected word lines WL(n±1) and WL_others, respectively.

In the area "far," the voltage of the non-selected word line WL(n±1) decreases due to the influence of the coupling with the selected word line WLn to which the read voltage CR is transferred. Since the increment $\delta$c is preset to be larger than the amount of decrease in voltage of the non-selected word line WL(n±1), however, the non-selected word line WL(n±1) maintains the voltage higher than the voltage VREADK+$\delta$ac even though the non-selected word line WL(n±1) is affected by the coupling with the selected word line WLn.

At a timing t33, the driver 130 maintains the application of the voltages CR and VREAD to the signal lines CGn and CG_others, while applying the voltage VREADK+$\delta$ac to the signal line CG(n±1). As a result, the row decoder module 120 transfers the voltages CR, VREADK+$\delta$ac, and VREAD to the selected word line WLn and the non-selected word lines WL(n±1) and WL_others, respectively.

In the area "far," both the voltages of the selected word line WLn and the non-selected word line WL(n±1) tend to decrease toward their respective target values. Thus, as compared to a case where the voltages of the word lines change in opposite directions, the amount of change in voltage between the selected word line WLn and the non-selected word line WL(n±1) is smaller, so that the influence of the coupling may be reduced. Accordingly, it is possible to expedite (assist) the convergence of the voltages of the selected word line WLn and the non-selected word line WL(n±1) in the area "far" after the timing t33 to the respective target values.

The period $\Delta$t3_1 (=t33−t32) is set to an appropriate value according to the magnitude of the difference between the read voltage CR and the voltage VREAD. For example, the timing t33 may be set to a timing at which a difference between the voltage of the non-selected word line WL (n±1) in the area "far" and the target value VREADK+$\delta$ac and a difference between the voltage of the selected word line WLn in the area "far" and the target value CR are equal to each other.

At a timing t34, the sequencer 170 asserts a first strobe signal in the read operation of the upper page. The sense amplifier module 140 senses whether the threshold voltage of the selected memory cell transistor MT is equal to or higher than the voltage CR. The sense amplifier module 140 stores the sensing result in the latch circuit ADL.

At a timing t35, the driver 130 maintains the application of the voltages VREADK+$\delta$ac and VREAD to the signal lines CG (n±1) and CG_others, while applying the voltage AR to the signal line CGn. The row decoder module 120 transfers the voltages AR and VREADK+$\delta$ac to the selected word line WLn and the non-selected word line WL(n±1), respectively.

In the area "far," the voltage of the non-selected word line WL(n±1) may decrease due to the coupling with the selected word line WLn to which the read voltage AR is transferred. As described above, however, the increment $\delta$ac is preset to be larger than the amount of decrease in voltage of the non-selected word line WL(n±1) caused from the coupling with the selected word line WLn. As a result, the non-selected word line WL(n±1) may maintain the voltage higher than the voltage VREADK even though the non-selected word line WL(n±1) is affected by the coupling with the selected word line WLn.

The operations at the timings t36 to t38 are the same as the operations at the timings t26 to t28 in FIG. 11. That is, the period $\Delta$t3_2 (=t36−t35) is set to an appropriate value according to the magnitude of the difference between the read voltages CR and AR. For example, the timing t36 may be set to a timing at which a difference between the voltage of the non-selected word line WL (n±1) in the area "far" and the target value VREADK and a difference between the voltage of the selected word line WLn in the area "far" and the target value AR are equal to each other. Thus, the period $\Delta$t3_2 is set to a value different from $\Delta$t3_1. Since it is assumed that the voltage difference between the read voltages CR and AR is larger than the voltage difference between the voltage VREAD and the read voltage CR, the example of FIG. 12 illustrates a case where the period $\Delta$t3_2 is set to be longer than the period $\Delta$t3_1.

Then, the read operation of the upper page ends.

3.2 Effects of Present Embodiment

According to the third embodiment, the row decoder module 120 applies the voltage VREADK+$\delta$c+$\delta$ac to the non-selected word line WL(n±1) before the read voltage CR is first applied to the selected word line WLn. Subsequently, after the read voltage CR is first applied to the selected word line WLn, the row decoder module 120 applies the voltage VREADK+$\delta$ac to the non-selected word line WL(n±1). Subsequently, after the read voltage AR is applied a second time to the selected word line WL, the row decoder module 120 applies the voltage VREADK to the non-selected word line WL(n±1). As a result, the voltage of the non-selected word line WL(n±1) may be prevented from becoming lower than the voltage VREADK due to the coupling when the voltage of the selected word line WLn decreases from the read voltage CR to the read voltage AR. Thus, the voltage of the selected word line WLn and the voltage of the non-selected word line WL(n±1) may quickly converge to the voltages AR and VREADK, respectively.

The increment δac and the period Δt3_2 are set according to the voltage difference between the read voltage CR applied first and the read voltage AR applied a second time. That is, the increment δac and the period Δt3_2 correlate with the voltage difference between the read voltages CR and AR. As a result, the increment δ and the period Δt may be adaptively set according to the magnitude of the influence of the coupling that the non-selected word line WL(n±1) receives from the selected word line WLn each time the read voltage is applied.

As described above, the highest voltage is applied to the non-selected word line WL(n±1) at the timing t31, and a relatively low voltage is gradually applied to the non-selected word line WL(n±1) without causing an increase of the voltage in the meantime. As a result, it is possible to prevent an increase in the number of times the voltage of the non-selected word line WL(n±1) changes. Thus, it is possible to prevent an increase in time required for the read operation.

4. Miscellaneous

The above-described first to third embodiments may be modified in various ways.

For example, the first to third embodiments describe a case where one memory cell transistor MT is capable of storing 2-bit data. However, the present disclosure is not limited thereto, and may be applied to a case where one memory cell transistor MT is capable of storing 3-bit, 4-bit, 5-bit or more data.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first memory cell;
a second memory cell adjacent to the first memory cell and connected to the first memory cell in series;
a first word line connected to the first memory cell;
a second word line connected to the second memory cell; and
a control circuit configured to:
in a first read operation reading data stored in the first memory cell,
apply a first voltage to the first word line and a second voltage to the second word line at first timing,
apply a first read voltage lower than the first voltage, to the first word line at second timing after the first timing, and
apply a third voltage lower than the second voltage and higher than the first voltage, to the second word line at third timing after the second timing.

2. The semiconductor storage device according to claim 1, wherein the control circuit is configured to:
in a second read operation reading data stored in the first memory cell and different from the first read operation,
apply the first voltage to the first word line, and a fourth voltage lower than the second voltage and higher than the third voltage to the second word line at fourth timing,
apply a second read voltage lower than the first voltage and higher than the first read voltage, to the first word line at fifth timing after the fourth timing, and
apply the third voltage to the second word line at sixth timing after fifth timing.

3. The semiconductor storage device according to claim 2, wherein
a first period being from the second timing to the third timing,
a second period being from the fifth timing to the sixth timing, and
the first period and the second period are different.

4. The semiconductor storage device according to claim 3, wherein the first period is longer than the second period.

5. The semiconductor storage device according to claim 1, wherein a voltage difference between the second voltage and the third voltage is correlated to a voltage difference between the third voltage and the first read voltage.

6. The semiconductor storage device according to claim 1, wherein a first period is correlated to a voltage difference between the third voltage and the first read voltage, the first period being from the second timing to the third timing.

7. The semiconductor storage device according to claim 2, wherein the control circuit is configured to assert a first strobe signal for the first read operation, during the application of the first read voltage to the first word line, and the control circuit is configured to assert a second strobe signal for the second read operation, during the application of the second read voltage to the first word line.

8. The semiconductor storage device according to claim 1, further comprising:
a third memory cell adjacent to the second memory cell and connected to the first memory cell in series via the second memory cell; and
a third word line connected to the third memory cell,
wherein the control circuit is configured to apply the first voltage to the third word line in the first read operation.

9. The semiconductor storage device according to claim 1, wherein the control circuit is configured to, in the first read operation,
apply a third read voltage, lower than the first read voltage, to the first word line at seventh timing after the second timing, and
apply a fifth voltage higher than the third voltage and different from the second voltage, to the second word line at eighth timing after third timing, and
apply the third voltage to the second word line at ninth timing after the eighth timing.

10. The semiconductor storage device according to claim 9, wherein the seventh timing is same as the eighth timing.

11. The semiconductor storage device according to claim 9, wherein
a first period being from the second timing to the third timing,
a third period being from the seventh timing to the ninth timing, and
the first period and the third period being different.

12. The semiconductor storage device according to claim 9, wherein a voltage difference between the fifth voltage and the third voltage is correlated to a voltage difference between the first read voltage and the third read voltage.

13. The semiconductor storage device according to claim 9, wherein a third period is correlated to a voltage difference between the first read voltage and the third read voltage, the third period being from the seventh timing to the ninth timing.

14. The semiconductor storage device according to claim 9, wherein the control circuit is configured to
assert a first strobe signal for the first read operation during the application of the first read voltage to the first word line, and
assert a second strobe signal for the first read operation during the application of the third read voltage to the first word line.

15. The semiconductor storage device according to claim 1, wherein the control circuit is configured to, in the first read operation,
apply a third read voltage lower than the first read voltage to the first word line at seventh timing after the second timing, and
apply a sixth voltage lower than the third voltage and higher than the first voltage, to the second word line at eight timing after the third timing.

16. The semiconductor storage device according to claim 15, wherein
a first period being from the second timing to the third timing
a fourth period being from the seventh timing to the eighth timing, and
the first period and the fourth period being different.

17. The semiconductor storage device according to claim 15, wherein a voltage difference between the third voltage and the sixth voltage is correlated to a voltage difference between the first read voltage and the third read voltage.

18. The semiconductor storage device according to claim 15, wherein a fourth period is correlate to a voltage difference between the first read voltage and the third read voltage, the fourth period being from the seventh timing to the eighth timing.

19. The semiconductor storage device according to claim 15, wherein the control circuit is configured to
assert a first strobe signal for the first read operation, during the application of the first read voltage to the first word line, and
assert a second strobe signal for the first read operation, during the application of the third read voltage to the first word line.

20. A semiconductor storage device comprising:
the semiconductor storage device according to claim 1; and
a memory controller configured to control the semiconductor storage device.

* * * * *